United States Patent
Ikegami

(10) Patent No.: US 12,046,463 B2
(45) Date of Patent: Jul. 23, 2024

(54) INSTRUMENTAL ANALYSIS DATA PROCESSING METHOD AND DEVICE

(71) Applicant: SHIMADZU CORPORATION, Kyoto (JP)

(72) Inventor: Masahiro Ikegami, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 906 days.

(21) Appl. No.: 17/059,717

(22) PCT Filed: Jun. 1, 2018

(86) PCT No.: PCT/JP2018/021282
§ 371 (c)(1),
(2) Date: Nov. 30, 2020

(87) PCT Pub. No.: WO2019/229998
PCT Pub. Date: Dec. 5, 2019

(65) Prior Publication Data
US 2021/0210319 A1    Jul. 8, 2021

(51) Int. Cl.
*H03M 7/34* (2006.01)
*H01J 49/00* (2006.01)
*H03M 7/46* (2006.01)

(52) U.S. Cl.
CPC .......... *H01J 49/0036* (2013.01); *H03M 7/46* (2013.01)

(58) Field of Classification Search
CPC .. H01J 49/0036; H01J 49/0004; H01J 49/164; H01J 49/40; H01J 49/0009;
(Continued)

(56) References Cited

U.S. PATENT DOCUMENTS 7,228,239 B1 *  6/2007  Cetto ................ H01J 49/0036
                                                  436/171
7,919,747 B2 *  4/2011  Green ................ H01J 49/36
                                                  250/281

(Continued)

FOREIGN PATENT DOCUMENTS

CN      105190303 A      12/2015
JP      2009-253706 A    10/2009
(Continued)

OTHER PUBLICATIONS

International Search Report of PCT/JP2018/021282 dated Aug. 14, 2018 [PCT/ISA/210].
(Continued)

*Primary Examiner* — Linh V Nguyen
(74) *Attorney, Agent, or Firm* — Sughrue Mion, PLLC

(57) ABSTRACT

After setting an intensity value equal to or lower than a predetermined level in mass spectrum data as invalid data, an uncompressed data array in which intensity values are arrayed in the order of m/z is divided into blocks per predetermined number of pieces of data. When significant intensity values are consecutive in order from the start of each block, this consecutive number and the respective intensity values are used as data for compression. When invalid data is consecutive, this consecutive number is used as data for compression. Then, sequence numbers of data at the start of each block after compression are collected to create an index and the index is stored together with the compressed data.

20 Claims, 15 Drawing Sheets

(58) Field of Classification Search
CPC .... H01J 49/004; H01J 49/027; H01J 49/0031;
H01J 49/04; H01J 49/0418; H03M 7/40;
H03M 7/30; H03M 7/24; H03M 7/3059;
H03M 7/3084; H03M 7/3088; H03M
7/4037; H03M 7/42; H03M 7/46; H03M
7/6011; H03M 7/6058; G06T
2207/30096; G06T 11/001; G06T
2207/10024; G06T 2207/10056; G06T
2207/30024; G06T 7/0012; G06T 7/11;
G06T 7/62; G06T 7/70; G06T 9/005;
G06V 9/20; G06V 10/28; G06V 10/30;
H04N 19/122; H04N 19/63; H04N
19/635; H04N 19/80
USPC .......................................................... 341/51
See application file for complete search history.

(56) References Cited

U.S. PATENT DOCUMENTS

| | | | | |
|---|---|---|---|---|
| 8,699,022 | B2* | 4/2014 | McManus | G01N 21/718 |
| | | | | 356/306 |
| 8,836,548 | B1* | 9/2014 | Chandra | G11B 20/00007 |
| | | | | 341/60 |
| 9,412,571 | B2* | 8/2016 | Ikegami | H01J 49/164 |
| 10,312,067 | B2* | 6/2019 | Ikegami | H01J 49/0004 |
| 2004/0245455 | A1* | 12/2004 | Reinhold | H01J 49/427 |
| | | | | 250/288 |
| 2010/0309031 | A1* | 12/2010 | Kawato | H01J 49/0036 |
| | | | | 341/87 |
| 2012/0209854 | A1 | 8/2012 | Ikegami | |
| 2016/0071711 | A1* | 3/2016 | Ikegami | H01J 49/0036 |
| | | | | 250/281 |
| 2016/0099423 | A1* | 4/2016 | Kim | H10K 85/6574 |
| | | | | 546/256 |
| 2017/0077949 | A1* | 3/2017 | Wheeler | H03M 7/6011 |
| 2019/0272984 | A1* | 9/2019 | Takeshita | H01J 49/164 |

FOREIGN PATENT DOCUMENTS

| | | |
|---|---|---|
| JP | 2012-169979 A | 9/2012 |
| WO | 2009/069225 A1 | 6/2009 |
| WO | 2014/175211 A1 | 10/2014 |

OTHER PUBLICATIONS

Written Opinion of PCT/JP2018/021282 dated Aug. 14, 2018 [PCT/ISA/237].

First Office Action dated Apr. 28, 2023 issued in Chinese Patent Application No. 201880093689.3.

* cited by examiner

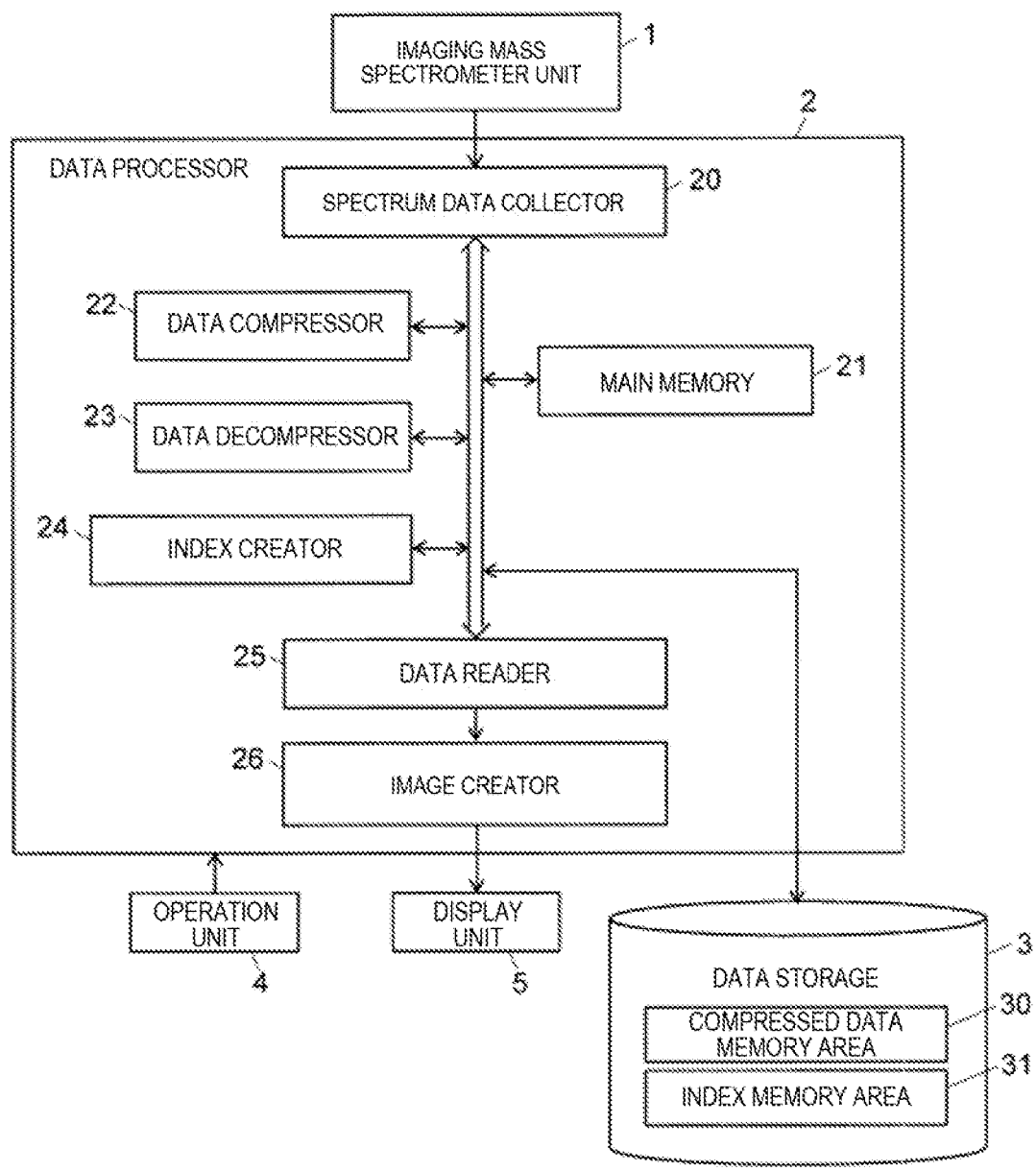

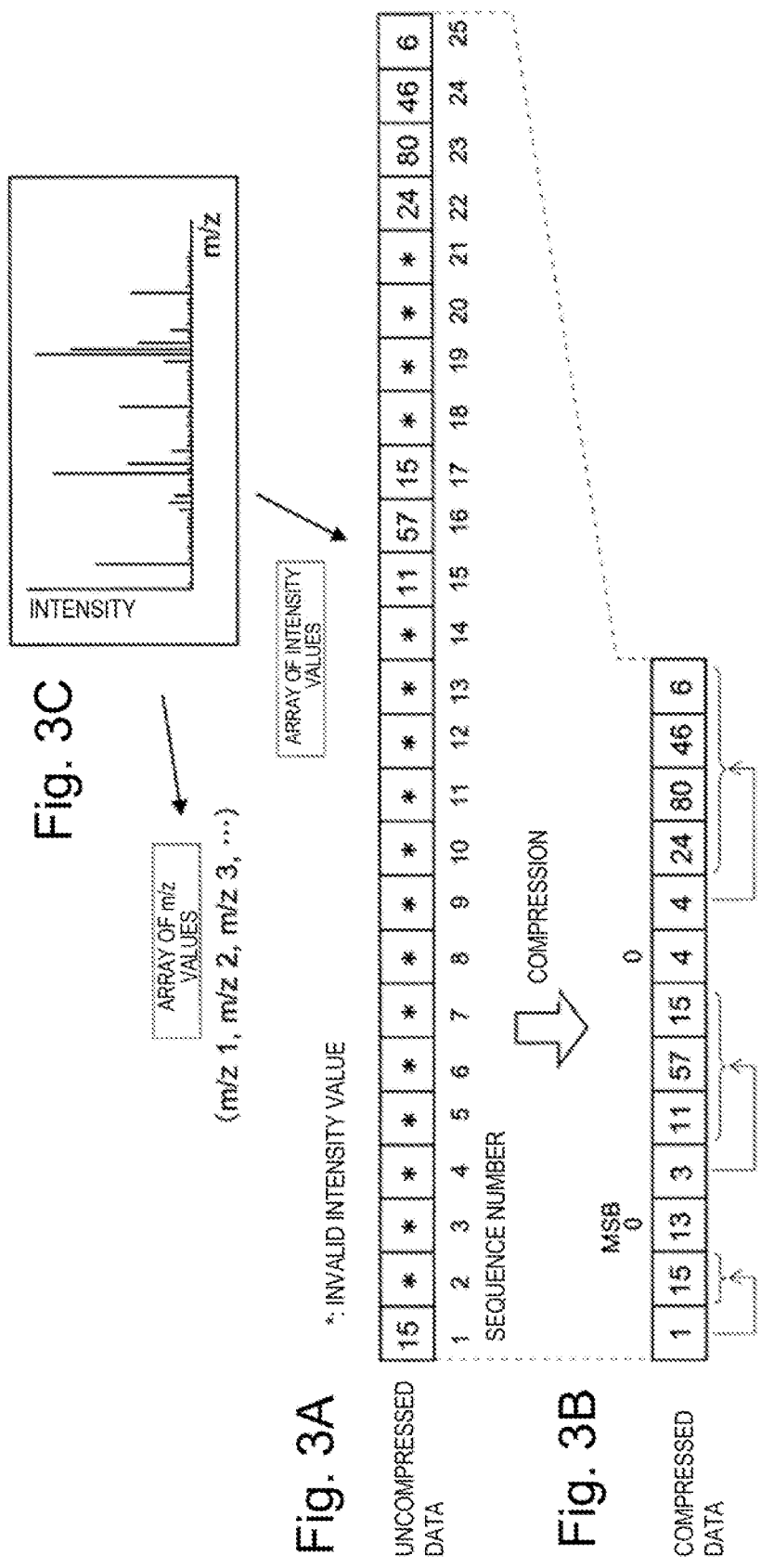

Fig. 4A

*: INVALID INTENSITY VALUE

UNCOMPRESSED DATA

| 15 | * | * | * | * | * | * | * | * | * | * | * | * | * | * | 11 | 57 | 15 | * | * | * | * | 24 | 80 | 46 | 6 |
|----|---|---|---|---|---|---|---|---|---|---|---|---|---|---|----|----|----|---|---|---|---|----|----|----|---|
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |

SEQUENCE NUMBER

← DATA CORRESPONDING TO SPECIFIC m/z VALUE AS TARGET

Fig. 4B

COMPRESSED DATA

MSB 0

| 1 | 15 | 13 | 3 | 11 | 57 | 15 | 0 | 4 | 4 | 24 | 80 | 46 | 6 |

| +1 | +13 | +3 | | | | +4 | +4 | | | |
|----|-----|----|----|----|----|----|----|----|----|----|
| 1 | 14 | 15 | 16 | 17 | 21 | 22 | 23 | 24 | 25 |

POSITION FROM START (SEQUENCE NUMBER ON UNCOMPRESSED DATA ARRAY)

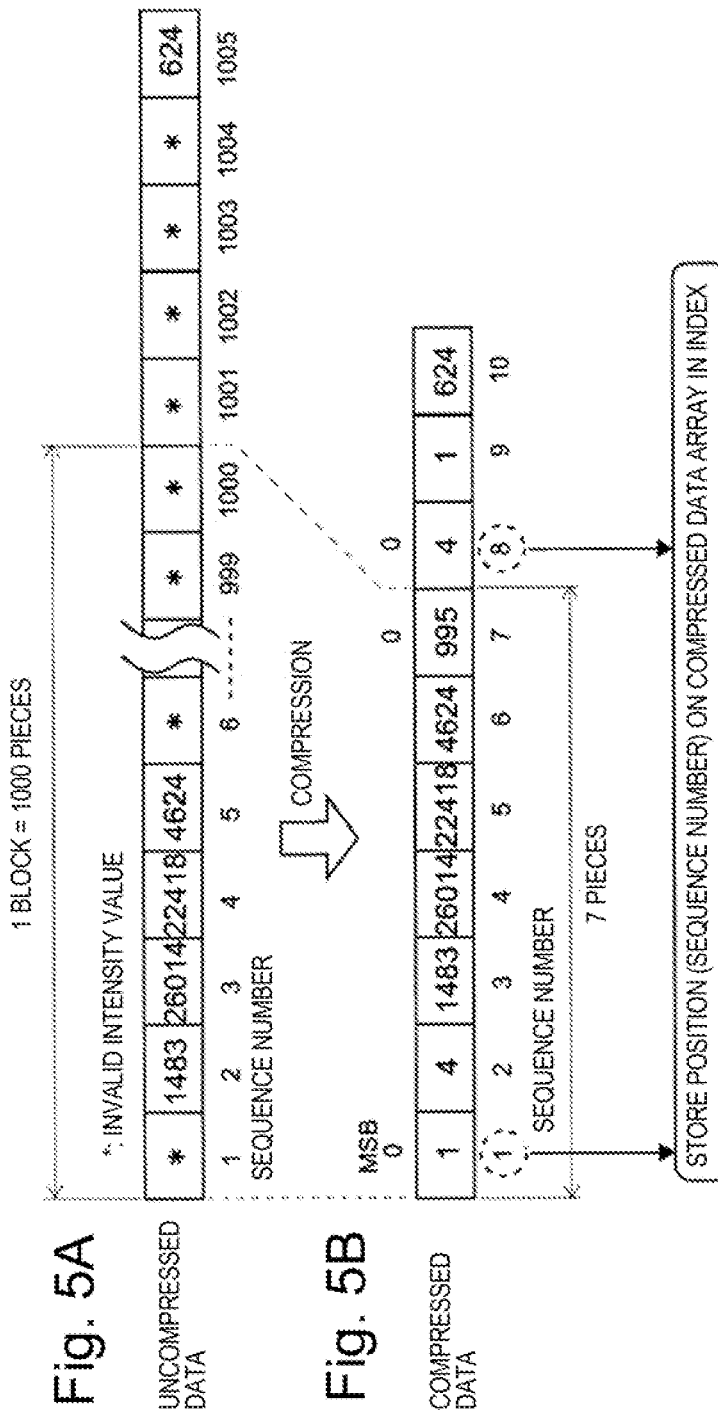

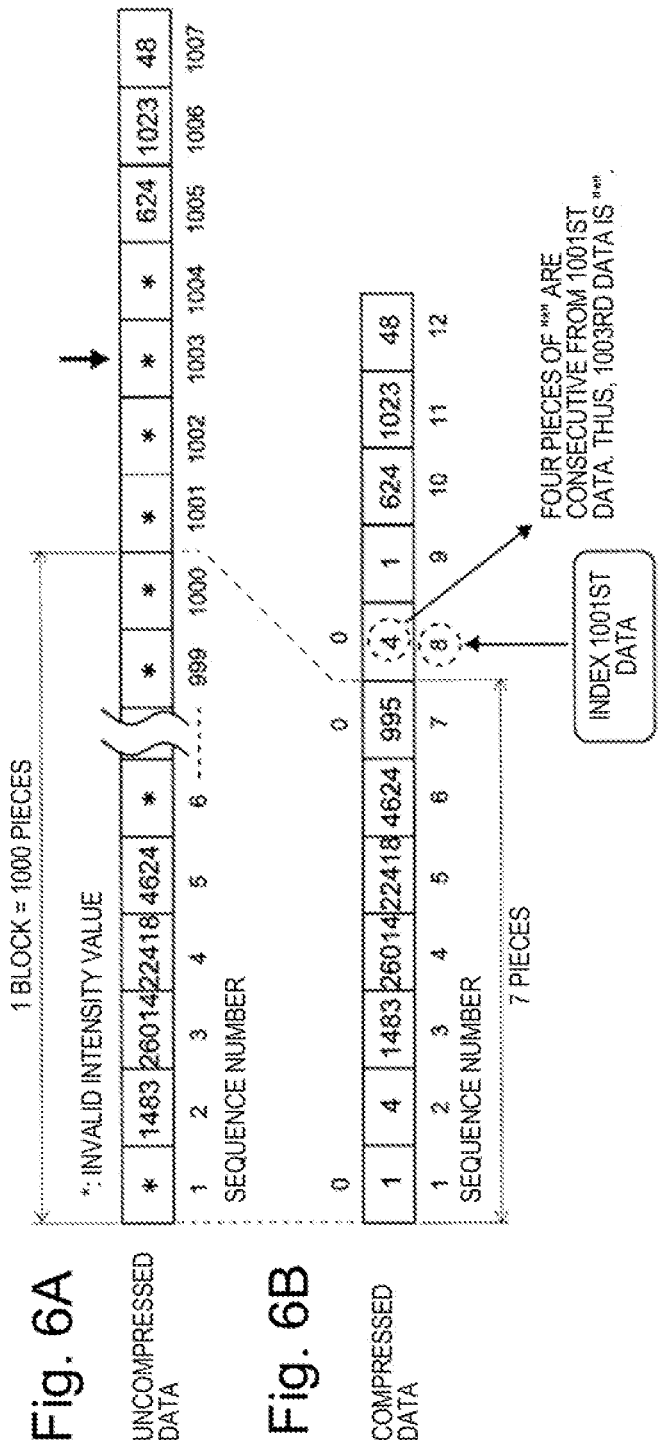

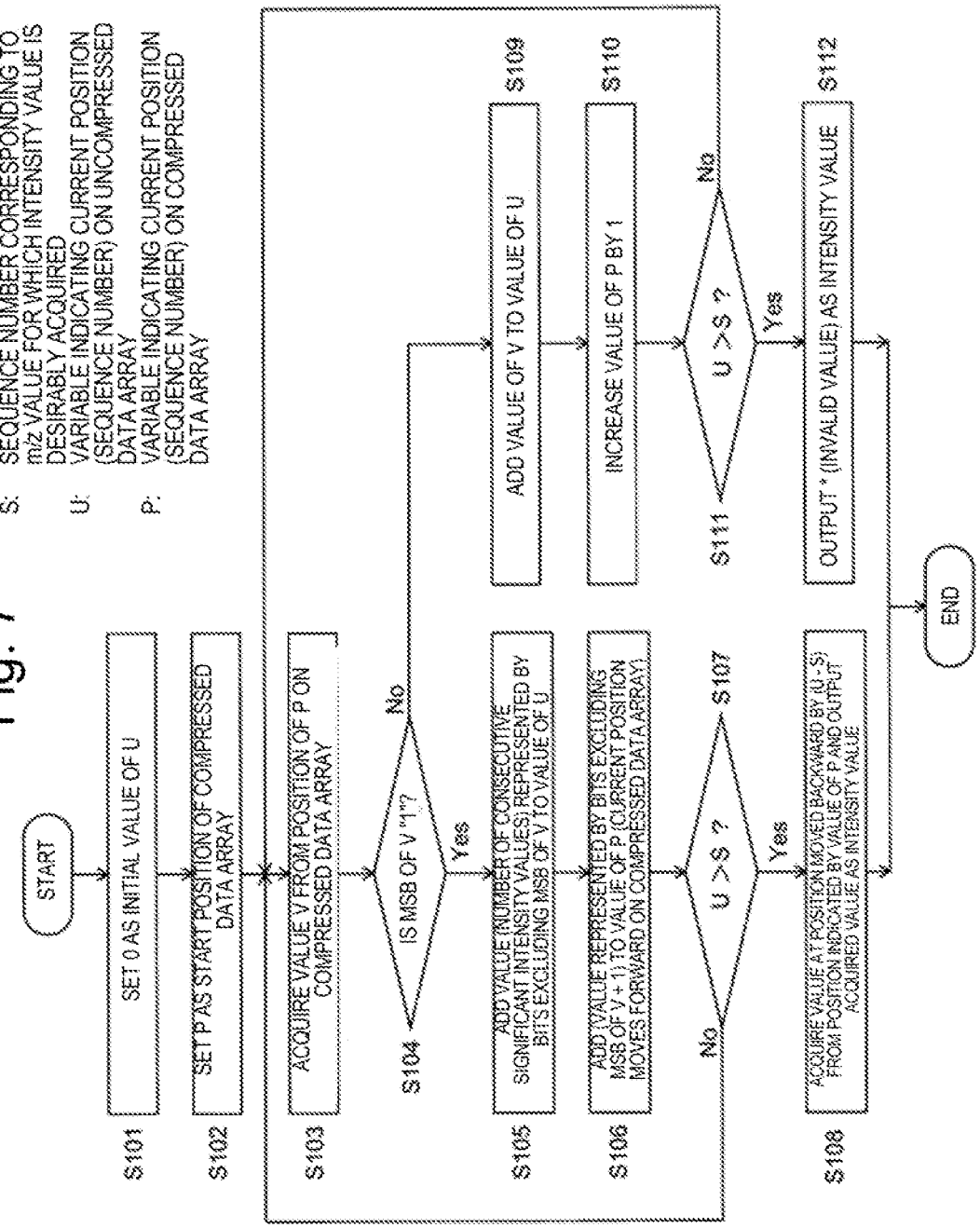

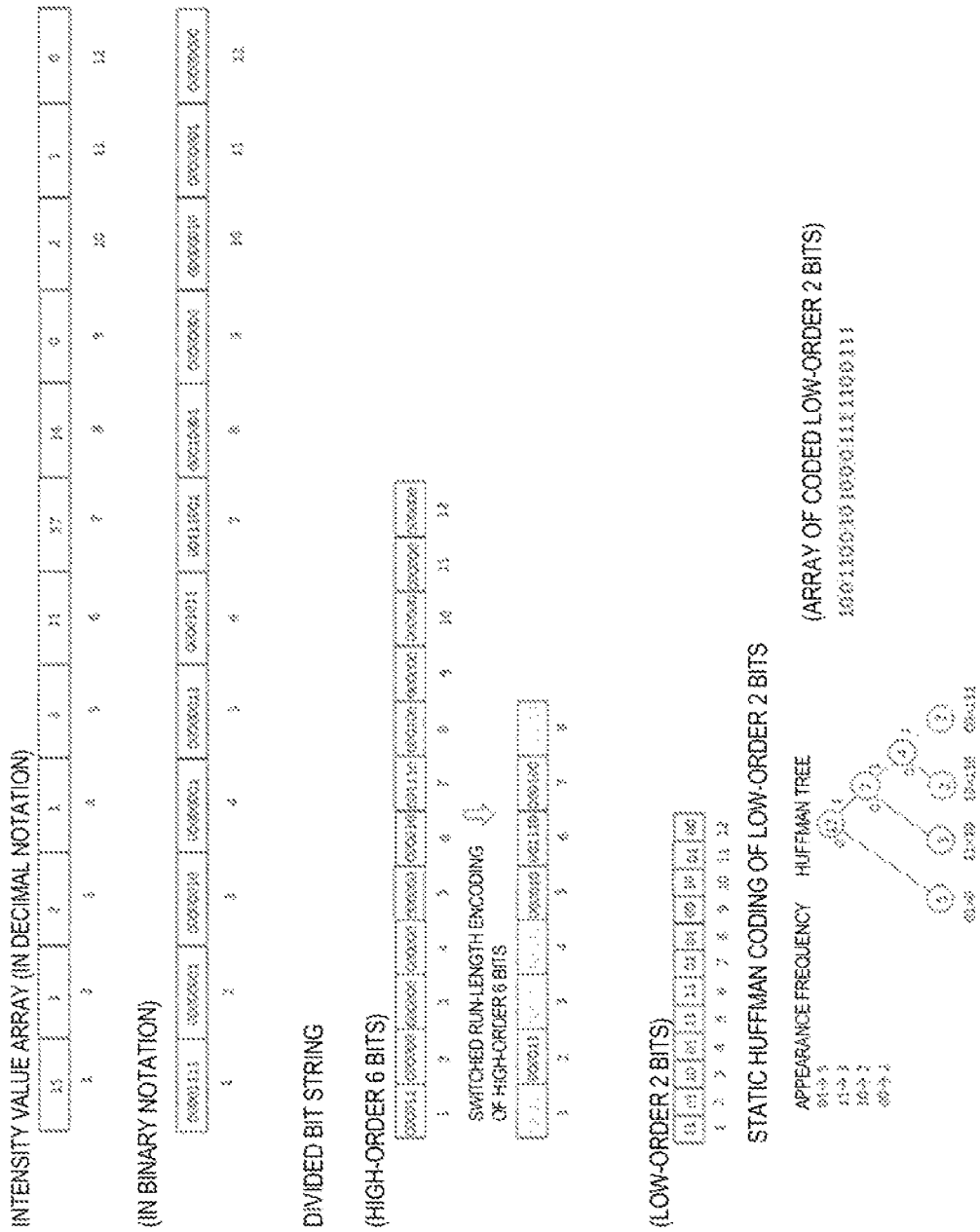

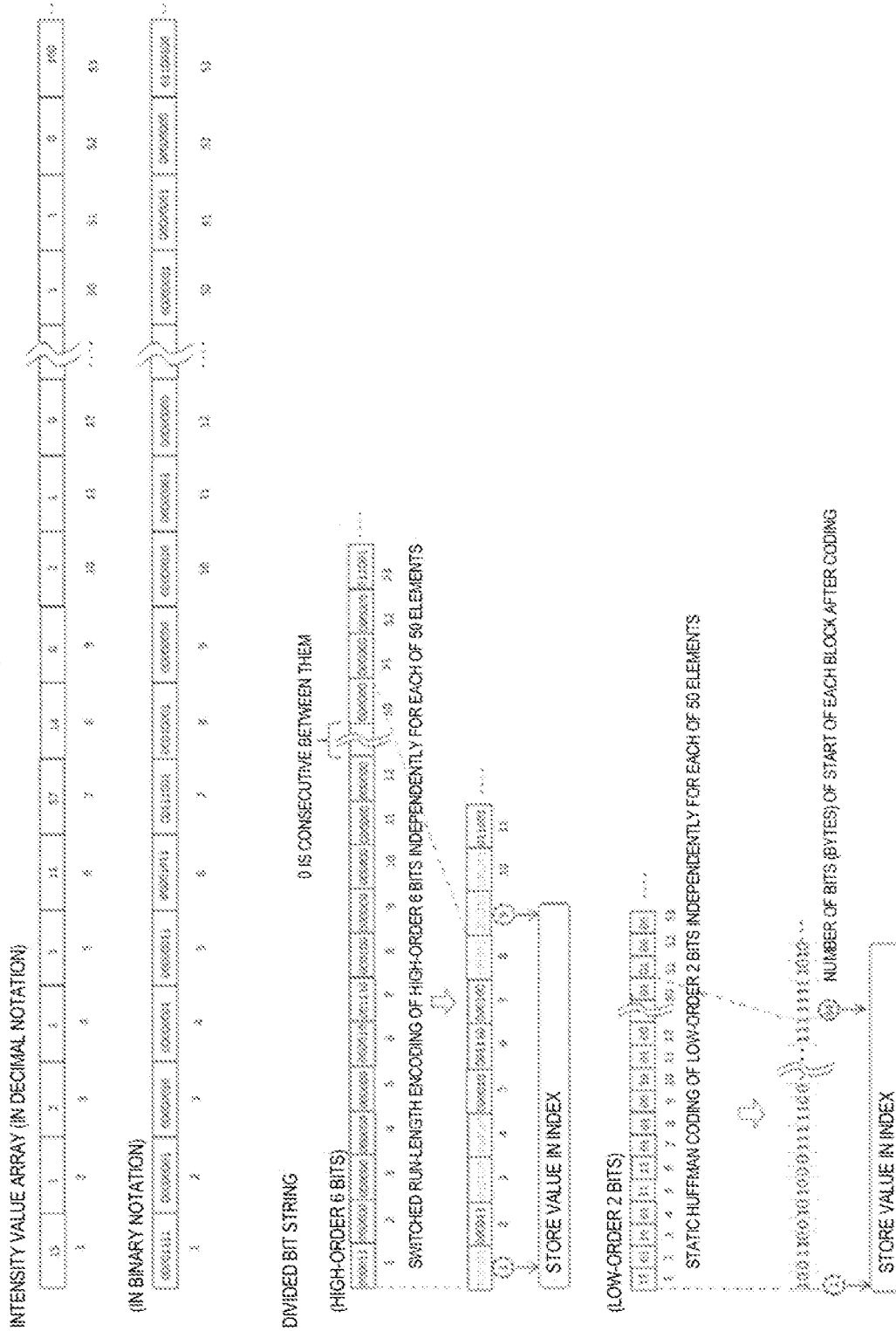

INSTRUMENTAL ANALYSIS DATA PROCESSING METHOD AND DEVICE

CROSS REFERENCE TO RELATED APPLICATIONS

This application is a National Stage of International Application No. PCT/JP2018/021282, filed Jun. 1, 2018.

TECHNICAL FIELD

The present invention relates to instrumental analysis data processing method and device that process measurement data collected by various analyzers, such as a mass spectrometer, a chromatograph device, an electron probe microanalyzer (EPMA), a Raman spectroscopic imaging device, and a Fourier transform infrared spectrometry (FTIR) imaging device, and more specifically, relates to a method and a device configured to compress measurement data obtained by an analyzer and process the compressed data to extract target information.

BACKGROUND ART

In recent years, the performance and functionality of analyzers for instrumental analysis have been remarkably improved, and the amount of data obtained by measurement in the analyzers has increased more and more. In particular, in analyzers such as imaging mass spectrometers and FTIR imaging devices, spectrum data in a predetermined mass-to-charge ratio range or wavelength range can be obtained at each of a large number of measurement points in a two-dimensional area on a sample, and thus, a huge amount of measurement data is obtained from one sample.

In general, measurement data obtained by an analyzer is processed by a computer (typically a general-purpose personal computer). When the amount of measurement data is enormous, it is difficult to store the entire measurement data in the main memory (RAM) for processing so that the processing speed decreases. In addition, when the amount of measurement data is large, it is necessary to prepare a large memory capacity to store the measurement data. Further, in recent years, there are more and more cases in which measurement data is transferred via a network and the data is analyzed by cloud computing or a computer located at a remote location, and a problem arises, such as an increase in time and cost for data transfer, if the amount of measurement data is large.

In recent years, various methods for compressing measurement data have been proposed in order to solve these problems.

For example, Patent Literature 1 discloses a method of compressing mass spectrum data having a high temporal resolution obtained by a time-of-flight mass spectrometer (TOFMS). In this compression method, a data array in which intensity values are arrayed in the order of mass-to-charge ratio (m/z) values in a mass spectrum is divided into a data array that can be regarded as a noise level and a data array other than that. Then, run-length encoding is performed on the data array excluding the data regarded as the noise level (that is, the data array that is highly likely to be useful), and static Huffman coding, which is a type of entropy encoding, is performed on the part regarded as the noise level. In this compression method, loss-free compression can be performed while increasing the compression rate.

In the above compression method, data that can be regarded as the noise level is also reflected in the compressed data. Thus, there is also known a method of reducing data by deleting data with an intensity value below a certain level from mass spectrum data (this is not strictly a compression method, but is assumed herein as one of the compression methods in a broad sense).

However, the compression method according to Patent Literature 1 has the following problems.

The data array representing the mass spectrum includes an array of m/z values in which pieces of information on the m/z values on the horizontal axis of the mass spectrum are stored, and an array of intensity values having the same number of pieces of data. For example, in a case of storing mass spectrum data for each of a large number of measurement points obtained by an imaging mass spectrometer or in a case of storing mass spectrum data for a large number of samples obtained by the same mass spectrometer, a data array before compression often includes an array of one m/z value common to a plurality of mass spectra and an array of intensity values respectively corresponding to the plurality of mass spectra.

For example, in a case of creating an image showing a two-dimensional intensity distribution at a specific m/z value based on data obtained by an imaging mass spectrometer, it is preferable to acquire intensity values from a sequence number of an intensity value corresponding to a target m/z value (a serial number assigned to each data with first data on a data array as "1") for uncompressed data. However, in the case of data compressed by the method described in Patent Literature 1, it is necessary to obtain an intensity value based on a sequence number corresponding to a target m/z value after performing a decompression process and associating the array of m/z values with the array of intensity values. If the decompression process is performed in this manner, the processing speed naturally decreases. The processing speed further decreases if the decompressed data fails to be stored in the main memory.

On the other hand, in the case of the method of performing compression by deleting the data whose intensity value is below the specific level from the mass spectrum data, it is necessary to prepare information on the array of m/z values for each mass spectrum. In such a case, it is necessary to find a sequence number corresponding to a target m/z value from arrays of m/z values different for the respective mass spectra in order to obtain an intensity value at the target m/z value from a large number of pieces of mass spectrum data. Therefore, the processing takes longer time as data has a larger m/z range or as the number of mass spectra increases.

As one method for increasing the processing speed to acquire the intensity value corresponding to the target m/z value in each mass spectrum, there is known a method of using an index that stores information indicating a correspondence between a position (sequence number) on a data array of an original mass spectrum and a position (sequence number) on a data array of compressed data. For example, in a data compression method described in Patent Literature 2, an index, which stores information that associates a sequence number of a start in an array after compression of a part where valid intensity values equal to or higher than a noise level are consecutive in an array of intensity values in a mass spectrum with a sequence number before compression, is separately created, and this index is referred to at the time of reading data.

In the compression method described in Patent Literature 2, however, there is a case where it is difficult to obtain a sufficient data compression effect because the amount of index data is large. For example, MALDI-TOFMS has an extremely wide measurable m/z range, and a large number of peaks are observed in a mass spectrum over the wide m/z range when measuring biological samples such as proteins. When such mass spectrum data is compressed by the method described in Patent Literature 2, index information is generated for each peak portion on the mass spectrum, and thus, the amount of index data itself becomes considerably large. If the amount of index data is large, it takes time to search a position of compressed data corresponding to a target m/z value on the index, and the processing speed for reading the target intensity value decreases. In addition, there arises another problem that the data compression efficiency is poor if the amount of index data is large.

Note that the above problem is not limited to the mass spectrum obtained by the mass spectrometer, but similarly exists in a case of processing data that constitutes a chromatogram obtained by a chromatograph device, an X-ray intensity spectrum obtained by an electron probe microanalyzer, a spectroscopic spectrum obtained by a Raman spectroscopic imaging device or an FTIR imaging device, or the like, and particularly in a case of processing a large number of spectra or chromatograms.

CITATION LIST

Patent Literature

Patent Literature 1: WO 2009/069225 A
Patent Literature 2: JP 2012-169979 A

SUMMARY OF INVENTION

Technical Problem

The present invention has been made in view of the above problems, and one of objects thereof is to provide instrumental analysis data processing method and device capable of reading an intensity value corresponding to an arbitrary m/z value at high speed, for example, from compressed data of mass spectrum data obtained by a mass spectrometer or the like.

Another object of the present invention is to provide instrumental analysis data processing method and device capable of compressing mass spectrum data such that an intensity value corresponding to an arbitrary m/z value can be read at high speed, for example, while ensuring a high data compression efficiency.

Solution to Problem

A first invention made to solve the above problems is an instrumental analysis data processing method of processing compressed data obtained by compressing measurement data which is a one-dimensional array of intensity values for a plurality of values of a predetermined parameter obtained by instrumental analysis by, when one or more intensity values at a predetermined invalid level are consecutive according to an array order, replacing the intensity values collectively with a number of the consecutive intensity values, and performing a switched run-length encoding when an intensity value at a significant level other than the invalid level appears. The instrumental analysis data processing method of obtaining an intensity value at a specific parameter value from the compressed data including:

a) a consecutive number identification step of acquiring and sequentially adding information on a number of consecutive intensity values at a significant level and a number of consecutive intensity values at an invalid level in order from a start of an array of compressed data to be processed and identifying a consecutive number when a result of the addition matches a sequence number corresponding to the specific parameter value as a target or exceeds the sequence number; and b) an intensity value search step outputting information indicating the invalid level or a specific intensity value associated with the invalid level as the intensity value at the specific parameter value when the consecutive number identified in the consecutive number identification step is the number of consecutive intensity values at the invalid level, and finding and outputting an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

A second invention is a device configured to perform the data processing method according to the first invention and is an instrumental analysis data processing device that processes compressed data obtained by compressing measurement data which is a one-dimensional array of intensity values for a plurality of values of a predetermined parameter obtained by instrumental analysis by, when one or more intensity values at a predetermined invalid level are consecutive according to an array order, replacing the intensity values collectively with a number of the consecutive intensity values, and performing a switched run-length encoding when an intensity value at a significant level other than the invalid level appears. The instrumental analysis data processing device, which obtains an intensity value at a specific parameter value from the compressed data, including:

a) a consecutive number identification unit configured to acquire and sequentially add information on a number of consecutive intensity values at a significant level and a number of consecutive intensity values at an invalid level in order from a start of an array of compressed data to be processed, and to identify a consecutive number when a result of the addition matches a sequence number corresponding to the specific parameter value as a target or exceeds the sequence number; and b) an intensity value search unit configured to output information indicating the invalid level or a specific intensity value associated with the invalid level as the intensity value at the specific parameter value when the consecutive number identified by the consecutive number identification unit is the number of consecutive intensity values at the invalid level, and to find and output an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

Note that the data compression method itself in the first and second inventions is conventionally known.

When an analyzer for instrumental analysis is a mass spectrometer including a liquid chromatograph mass spectrometer (LC-MS) or a gas chromatograph mass spectrometer (GC-MS), the predetermined parameter is an m/z value, and the measurement data is mass spectrum data.

When the analyzer is a chromatograph device such as LC or GC, the predetermined parameter is time and the measurement data is chromatogram data.

When the analyzer is a Raman spectroscopic analyzer or FTIR, the predetermined parameter is a wavelength (or wave number), and the measurement data is spectroscopic spectrum data. When the analyzer is EPMA, the predetermined parameter is a wavelength or energy of an X-ray, and the measurement data is X-ray spectrum data.

For example, it is assumed that the measurement data is the mass spectrum data. In the data processing device according to the second invention that performs the data processing method of the first invention, for example, when a specific m/z value for which a user desires to know an intensity value is specified by the user, the consecutive number identification unit acquires and sequentially adds data representing the number of consecutive intensity values at the significant level and the number of consecutive intensity values at the invalid level in order from the start of the array of the compressed data to be processed. Then, every time the consecutive number is added, it is determined whether the addition result matches or exceeds the sequence number (element number on the array) of the specific m/z value as a target. If the addition result matches or exceeds the sequence number of the specific m/z value as the target, the consecutive number at that time is identified as a target consecutive number. At this time, only the data representing the consecutive number may be selectively observed in order from the start of the compressed data array, and the data representing the intensity value at the significant level may be ignored.

Next, an intensity value search unit outputs the invalid level or a specific intensity value associated with the invalid value when the identified consecutive number is the number of consecutive intensity values at the invalid level. On the other hand, when the identified consecutive number is the number of consecutive intensity values at the significant level, a target intensity value exists in an array of intensity values following data representing the consecutive number, and thus, the number of pieces of data is counted based on the addition result of the consecutive number and a target sequence number in order from the start of the array to find and output the intensity value of the relevant sequence number. Note that the "invalid level or the specific intensity value associated with the invalid level" referred to herein may be a specific value including, for example, "0", or a predetermined value that hardly exists as an actual intensity value. For example, when an intensity value of "4" or less is regarded as the invalid level, any value equal to or less than "4" including "0" may be defined as the invalid level or the specific intensity value associated with the invalid level.

In this manner, in the first and second inventions, the simple process of finding the data representing the consecutive numbers in the compressed array and adding the consecutive numbers is performed without decompressing the compressed data to be returned to the original measurement data. Thus, it is possible to quickly obtain the intensity value corresponding to the specific parameter value as the target, for example, the m/z value.

Note that whether a certain piece of data represents the number of consecutive intensity values at the significant level or represents the number of consecutive intensity values at the invalid level may be identified based on information (0 or 1) on a bit of part of the data. For example, when a bit length of one piece of data is 2 bytes (16 bits), its most significant bit (MSB) may be used to identify whether the data represents the number of consecutive intensity values at the invalid level or represents the other (data representing the number of consecutive intensity values at the significant level and data representing the intensity values), and the remaining 15 bits may be used to represent the consecutive number and numerical values of the intensity values.

When a consecutive number exceeds the maximum number (32767) that can be represented by 15 bits, it is preferable to write the consecutive number up to the maximum number, and then, write the remaining consecutive number of the portion exceeding the maximum number in the next data.

As described above, the simple process of finding the data representing the consecutive numbers in order from the start of the compressed array and adding the consecutive numbers is performed in the first and second inventions. Thus, it is possible to quickly obtain the intensity value corresponding to the specific parameter value as the target, for example, the m/z value without decompressing the compressed data to be returned to the original measurement data. This is advantageous for processing that uses the entire intensity value array, such as addition or subtraction of all elements of a plurality of intensity value arrays and addition of values of all elements in an array. On the other hand, in a case of acquiring intensity value information of a specific element near an end of an intensity value array having a large number of elements, addition of many consecutive numbers is required in order to obtain an intensity value of one element, which takes a long processing time.

A third invention made to solve such a problem is an instrumental analysis data processing method of compressing measurement data, which is a one-dimensional array of intensity values for a plurality of values in a predetermined parameter obtained by instrumental analysis, including:

a) a data division step of dividing the array of the measurement data into blocks per predetermined number of pieces of data;

b) an array conversion step of obtaining a compressed data array in each block by, when one or more intensity values at a predetermined invalid level are consecutive according to an array order of measurement data included in the block, replacing the intensity values collectively with a number of the consecutive intensity values for each block, and performing a switched run-length encoding when an intensity value at a significant level other than the invalid level appears; and c) an index creation step of creating an index by collecting information on sequence numbers indicating positions of start data of the respective blocks on an one-dimensional array, which is an array of the compressed data of the blocks, and storing the index in association with the one-dimensional array.

A fourth invention is a device configured to perform the data processing method according to the third invention described above, and is an instrumental analysis data processing device, configured to compress measurement data, which is a one-dimensional array of intensity values for a plurality of values in a predetermined parameter obtained by instrumental analysis, including:

a) a data division unit configured to divide the array of the measurement data into blocks per predetermined number of pieces of data;

b) an array conversion unit configured to obtain a compressed data array in each block by, when one or more intensity values at a predetermined invalid level are consecutive according to an array order of measurement data included in the block, replacing the intensity values collectively with a number of the consecutive intensity values for each block, and performing a switched run-length encoding when an intensity value at a significant level other than the invalid level appears; and c) an index creation unit configured to create an index by collecting information on sequence numbers indicating positions of start data of the respective blocks on an one-dimensional array, which is an array of the compressed data of the blocks, and store the index in association with the one-dimensional array.

In the third and fourth inventions, the data compression method does not exist in the related art, which is different from the first and second inventions. That is, in the instrumental analysis data processing method according to the third invention, the array of the measurement data is first divided into blocks including the predetermined number of pieces of data in the data division step. Then, in the array conversion step, the compressed array is obtained by, when one or more intensity values at the predetermined invalid level are consecutive according to the array order of the data, replacing the intensity values collectively with the number of the consecutive intensity values for each block, and performing the switched run-length encoding when the intensity value at the significant level appears. That is, the same compression as that used in the first and second inventions may be independently performed for each block. Since the compression is performed in block units with the limited number of pieces of data, the compression efficiency is slightly lower as compared with a case of not performing the division into blocks (that is, a case where there is no limit on the number of pieces of data), but the influence is practically small.

Since the compression is performed independently for each block as described above, the number of pieces of measurement data included in one block is constant, but the number of pieces of compressed data corresponding to one block is not constant. Therefore, in the index creation step, the index is created by collecting identification information indicating the position of the start data of each block in the compressed array, specifically, the sequence number on the one-dimensional array which is the array of the entire compressed data. In this case, since one index information is obtained for one block, the amount of index information is completely irrelevant to a sequence of intensity values of the measurement data before compression and the array after compression. For example, when compressing mass spectrum data, the width of an m/z range that determines the number of data points is related to the amount of index data, but the number of observed peaks and its density are irrelevant to the amount of index data. Therefore, in the third and fourth inventions, the amount of index data does not become extremely large, and the amount of compressed data including the index can be suppressed.

In the third invention, the instrumental analysis data processing method of processing compressed data, obtained by compression through processing in each step of the data division step, the array conversion step, and the index creation step, may preferably include: in order to obtain an intensity value at a specific parameter value from the compressed data, d) a block identification step of referring to the index to identify a block including information obtained by compressing uncompressed data corresponding to a sequence number of data at the specific parameter value as a target and obtaining information on a start data position of the block;

e) a consecutive number identification step of acquiring and sequentially adding information on a number of consecutive intensity values at a significant level and a number of consecutive intensity values at an invalid level in order from a start of an array of compressed data corresponding to the identified block, and identifying a consecutive number when a result of the addition matches a sequence number corresponding to the specific parameter value as a target or exceeds the sequence number; and f) an intensity value search step outputting information indicating the invalid level or a specific intensity value associated with the invalid level as the intensity value at the specific parameter value when the consecutive number identified in the consecutive number identification step is the number of consecutive intensity values at the invalid level, and finding and outputting an intensity value of the sequence number from among intensity values between data indicating the consecutive number on the compressed data array and data indicating a consecutive number appearing next as the intensity value at the specific parameter value when the identified consecutive number is the number of consecutive intensity value at the significant level.

Similarly, in the fourth invention, the instrumental analysis data processing device configured to process compressed data, obtained by compression through processing in each unit of the data division unit, the array conversion unit, and the index creation unit, may preferably include:

in order to obtain an intensity value at a specific parameter value from the compressed data, d) a block identification unit configured to refer to the index to identify a block including compressed information of uncompressed data corresponding to a sequence number of data at the specific parameter value as a target, and to obtain information on a start data position of the block;

e) a consecutive number identification unit configured to acquire and sequentially add information on a number of consecutive intensity values at a significant level and a number of consecutive intensity values at an invalid level in order from a start of an array of compressed data corresponding to the identified block, and to identify a consecutive number when a result of the addition matches a sequence number corresponding to the specific parameter value as a target or exceeds the sequence number; and f) an intensity value search unit configured to output information indicating the invalid level or a specific intensity value associated with the invalid level as the intensity value at the specific parameter value when the consecutive number identified by the consecutive number identification unit is the number of consecutive intensity values at the invalid level, and to find and output an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

That is, in the above preferred data processing method and device, the index is first used to search any block out of the plurality of blocks where the information of the intensity value corresponding to the target m/z value exists. Then, if the block is identified, the intensity value corresponding to, for example, the target m/z value is acquired by the procedure similar to that in the first and second inventions. Although it is always necessary to find and add the information on the consecutive numbers in order from the start of the data array in the first and second inventions, the information on the consecutive numbers may be found and added in order from the start of the data array included in one block in the preferred method and device according to the third and fourth inventions. Therefore, the time to search for the intensity value corresponding to the target m/z value can be shortened by limiting the number of pieces of data when dividing into the blocks to some extent although depending on the number of pieces of data included in one block. That is, the target intensity value can be obtained in a processing time shorter than that in the first and second inventions.

A signal compression method used in the above-described first to fourth inventions is a lossy compression method that replaces a signal having an intensity value equal to or lower than a predetermined level with a consecutive number based on the premise that a signal having a minute intensity value is not important or is not necessarily used without any problem. Therefore, it is not possible to completely restore the original measurement data from the compressed data. Depending on a type of analysis or a purpose of analysis, there is a case where a signal having a minute intensity value, which is replaced with the consecutive number in the above compression method, is also required. For such a purpose, the lossless compression method described in Patent Literature 1 is advantageous.

A first aspect of a fifth invention made to solve the above problem is obtained by applying the instrumental analysis data processing method of the first invention to data compressed by a compression method described in Patent Literature 1, and is a data processing method of dividing a bit string of measurement data, which is a one-dimensional array of intensity values for a plurality of values in a predetermined parameter obtained by instrumental analysis, into a low-order bit string equal to or lower than a predetermined level and a high-order bit string other than the low-order bit string to obtain a plurality of data arrays and processing compressed data formed of a plurality of compressed data arrays obtained by performing compression on a data array including the high-order bit string using at least switched run-length encoding and not performing compression on a data array including the low-order bit string. The instrumental analysis data processing method of obtaining an intensity value at a specific parameter value from the compressed data including:

a) a consecutive number identification step of acquiring and sequentially adding information on a consecutive number of a bit string indicating a value other than "0" and a consecutive number of a bit string indicating "0" in order from a start of a compressed data array corresponding to the high-order bit string among the plurality of compressed data arrays to be processed, and identifying a consecutive number when a result of the addition matches a sequence number corresponding to the specific parameter value as a target or a consecutive number immediately before the addition result exceeds the sequence number;

b) a high-order bit information search step of outputting a value of "0" as a high-order bit string in the specific parameter value when the identified consecutive number is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and c) an intensity value acquisition step of acquiring information on the low-order bit string from the sequence number corresponding to the specific parameter value in the compressed data array corresponding to the low-order bit string, and acquiring intensity value information for the specific parameter value together with information on the bit string output by the high-order bit information search step.

Similarly to the first aspect, a second aspect of a fifth invention made to solve the above problem is obtained by applying the data processing method of the first invention to data compressed by a compression method described in Patent Literature 1, and is a data processing method of dividing a bit string of measurement data, which is a one-dimensional array of intensity values for a plurality of values in a predetermined parameter obtained by instrumental analysis, into a low-order bit string equal to or lower than a predetermined level and a high-order bit string other than the low-order bit string to obtain a plurality of data arrays and processing compressed data formed of a plurality of compressed data arrays obtained by performing compression on a data array including the high-order bit string using at least switched run-length encoding and performing compression on a data array including the low-order bit string using static Huffman coding. The data processing method for instrumental analysis of obtaining an intensity value at a specific parameter value from the compressed data including:

a) a consecutive number identification step of acquiring and sequentially adding information on a consecutive number of a bit string indicating a value other than "0" and a consecutive number of a bit string indicating "0" in order from a start of a compressed data array corresponding to the high-order bit string among the plurality of compressed data arrays to be processed, and identifying a consecutive number when a result of the addition matches a sequence number corresponding to the specific parameter value as a target or a consecutive number immediately before the addition result exceeds the sequence number;

b) a high-order bit information search step of outputting a value of "0" as a high-order bit string in the specific parameter value when the identified consecutive number is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and c) an intensity value acquisition step of decompressing all compressed data arrays corresponding to the low-order bit string among the plurality of compressed data arrays to be processed, acquiring information on the low-order bit string corresponding to the specific parameter value from the decompressed data array, and acquiring intensity value information for the specific parameter value together with information on the bit string output by the high-order bit information search step.

In this case, the low-order bits are compressed by the static Huffman coding, and thus, the compression efficiency is improved as compared with that of the compression method used in the first aspect, but it is disadvantageous in terms of processing time because it is necessary to restore the entire low-order bit arrays by the decompression process and then search for a value of the low-order bit corresponding to the specific parameter value as the target.

Further, a sixth invention made to solve the above problems is a combination of the compression method described in Patent Literature 1 and the compression method in the data processing method of the third invention described above, and is an instrumental analysis data processing method for compressing measurement data, which is a one-dimensional array of intensity values for a plurality of values in a predetermined parameter obtained by instrumental analysis, including:

a) a data division step of dividing the array of the measurement data into blocks per predetermined number of pieces of data;

b) an array conversion step of dividing a bit string of the measurement data included in a relevant block into a low-order bit string equal to or lower than a predetermined level and a high-order bit string other than the low-order bit string per block to obtain a plurality of data arrays and obtaining a plurality of compressed data arrays in the respective blocks by performing at least switched run-length encoding on a data array including the high-order bit string and performing no compression or static Huffman coding on a data array including the low-order bit string per block;

c) an index creation step of creating indices by collecting information on sequence numbers indicating positions of start data of the respective blocks on an one-dimensional array, which is an array of the data, for the plurality of compressed data arrays in the respective blocks, and storing the indices in association with the plurality of compressed data arrays in the respective blocks obtained in the array conversion step.

A seventh invention is a device configured to perform the data processing method according to the sixth invention described above, and is an instrumental analysis data processing device, configured to compress measurement data, which is a one-dimensional array of intensity values for a plurality of values in a predetermined parameter obtained by instrumental analysis, including:

a) a data division unit configured to divide the array of the measurement data into blocks per predetermined number of pieces of data;

b) an array conversion unit configured to divide a bit string of the measurement data included in a relevant block into a low-order bit string equal to or lower than a predetermined level and a high-order bit string other than the low-order bit string per block to obtain a plurality of data arrays, and to obtain a plurality of compressed data arrays in the respective blocks by performing at least switched run-length encoding on a data array including the high-order bit string and performing no compression or static Huffman coding on a data array including the low-order bit string per block;

c) an index creation unit configured to create indices by collecting information on sequence numbers indicating positions of start data of the respective blocks on an one-dimensional array, which is an array of the data, for the plurality of compressed data arrays in the respective blocks, and storing the indices in association with the plurality of compressed data arrays in the respective blocks obtained by the array conversion unit.

The same effects as those of the third invention and the fourth invention can be achieved even in the sixth invention and the seventh invention.

In the sixth invention described above, the instrumental analysis data processing method, which processes compressed data obtained by compression in each step of the data division step, the array conversion step, and the index creation step, the compressed data in which compression is not performed on the low-order bit string in the array conversion step, preferably includes:

in order to obtain an intensity value at a specific parameter value from the compressed data, d) a first block identification step of referring to an index corresponding to the high-order bit string among the indices to identify a block including information obtained by compressing an uncompressed high-order bit string corresponding to a sequence number of data at the specific parameter value as a target and obtaining information on a start data position of the block;

e) a consecutive number identification step of acquiring and sequentially adding information on a consecutive number of a bit string indicating a value other than "0" and a consecutive number of a bit string indicating "0" in order from a start of a compressed data array corresponding to the block identified in the first block identification step, and identifying a consecutive number when a result of the addition matches a sequence number corresponding to the specific parameter value as a target or a consecutive number immediately before the addition result exceeds the sequence number;

f) a high-order bit information search step of outputting a value of "0" as a high-order bit string in the specific parameter value when the consecutive number identified in the consecutive number identification step is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and g) an intensity value acquisition step of acquiring information on the low-order bit string from the sequence number corresponding to the specific parameter value, and acquiring intensity value information for the specific parameter value together with information on the bit string output by the high-order bit information search step.

When the data array of the low-order bits has been subjected to Huffman coding, the instrumental analysis data processing method, which processes compressed data obtained by compression in each step of the data division step, the array conversion step, and the index creation step, the compressed data in which compression has been performed on the low-order bit string using static Huffman coding in the array conversion step, includes:

in order to obtain an intensity value at a specific parameter value from the compressed data, d) a first block identification step of referring to an index corresponding to the high-order bit string among the indices to identify a block including information obtained by compressing an uncompressed high-order bit string corresponding to a sequence number of data at the specific parameter value as a target and obtaining information on a start data position of the block;

e) a consecutive number identification step of acquiring and sequentially adding information on a consecutive number of a bit string indicating a value other than "0" and a consecutive number of a bit string indicating "0" in order from a start of a compressed data array corresponding to the block identified in the first block identification step, and identifying a consecutive number when a result of the addition matches a sequence number corresponding to the specific parameter value as a target or a consecutive number immediately before the addition result exceeds the sequence number;

f) a high-order bit information search step of outputting a value of "0" as a high-order bit string in the specific parameter value when the consecutive number identified in the consecutive number identification step is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and g) a second block identification step of referring to an index corresponding to the among the indices to identify a block including an uncompressed low-order bit string corresponding to a sequence number of data at the specific parameter value as a target and obtaining information on a start data position of the block;

h) an intensity value acquisition step of decompressing all compressed data arrays derived from low-order bits corresponding to the block identified in the second block identification step, acquiring information on the low-order bit string corresponding to the specific parameter value from a decompressed data array based on a difference between the sequence number corresponding to the specific parameter value and a sequence number at the start of the block, and acquiring intensity value information for the specific parameter value together with information on the bit string output by the high-order bit information search step.

Advantageous Effects of Invention

According to the first, second, and fifth inventions, it is possible to acquire the intensity value corresponding to the arbitrary parameter value such as the arbitrary m/z value at high speed from the compressed data in the state where the measurement data such as the mass spectrum data has been compressed. As a result, it is possible to create and display an image at the arbitrary m/z value in a short time, for example, based on the mass spectrum data for each of a large number of measurement points collected by an imaging mass spectrometer.

According to the third, fourth, and sixth inventions, it is possible to acquire the intensity value corresponding to the arbitrary m/z value or the like at a higher speed than the first, second, and fifth inventions, that is, with a shorter processing time while ensuring the high data compression efficiency.

BRIEF DESCRIPTION OF DRAWINGS

FIG. 2 is a schematic configuration diagram of an imaging mass spectrometry system using another embodiment of the instrumental analysis data processing device according to the present invention.

FIGS. 3A-3C are explanatory views of a principle of a first data compression method.

FIGS. 4A-4B are explanatory views of a processing procedure when an intensity value at a specific m/z position is obtained from compressed data in the first data compression method.

FIGS. 5A-5B are explanatory views of a principle of a second data compression method.

FIGS. 6A-6B are explanatory views of a processing procedure when an intensity value at a specific m/z position is obtained from compressed data in the second data compression method.

FIG. 7 is a flowchart illustrating a processing flow when the intensity value at the specific m/z position is obtained from the compressed data in the first data compression method.

FIG. 14 is an explanatory view of a principle of a third data compression method.

FIG. 15 is an explanatory view of a principle of a fourth data compression method.

DESCRIPTION OF EMBODIMENTS

Figure 1:
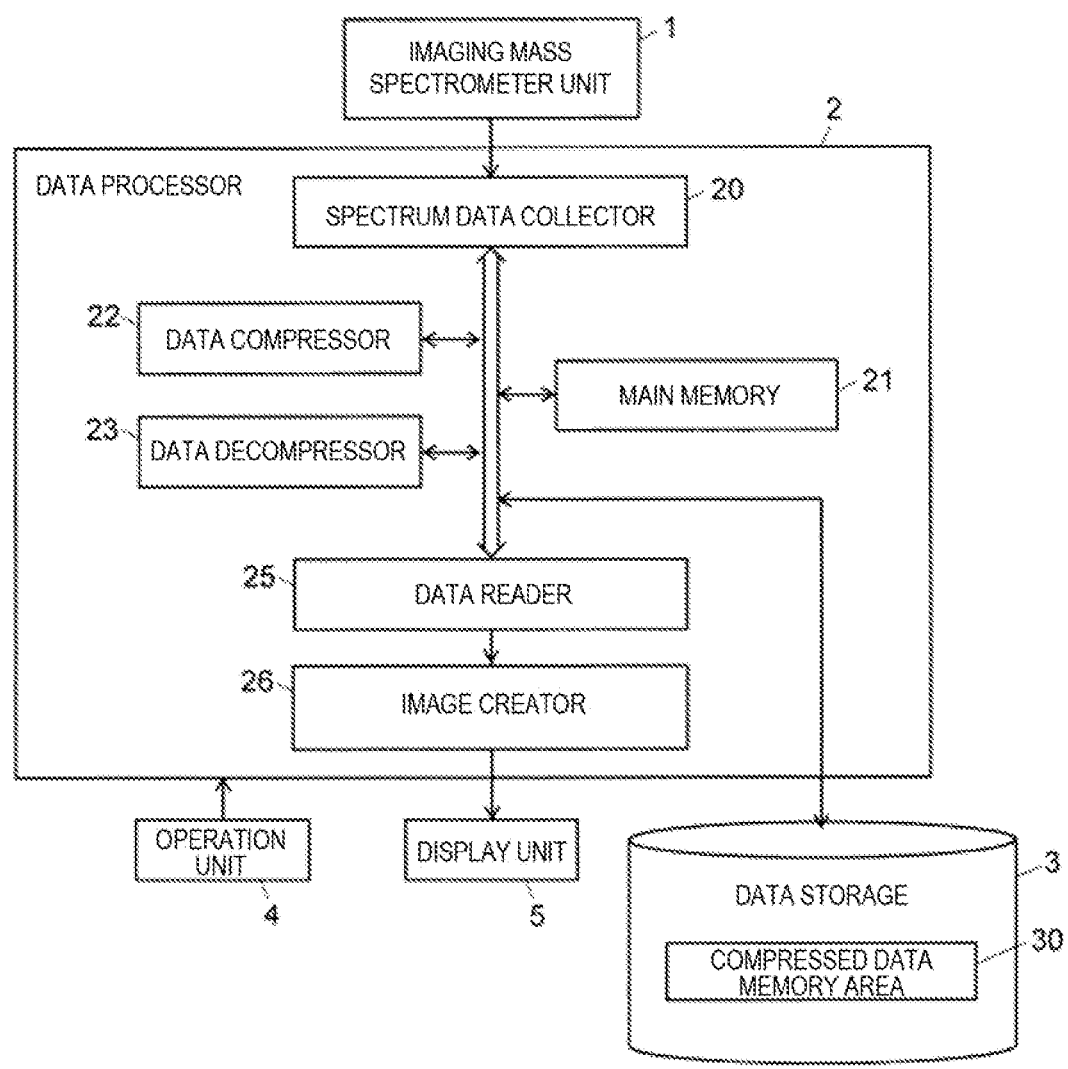
FIG. 1 is a schematic configuration diagram of an imaging mass spectrometry system using an embodiment of an instrumental analysis data processing device according to the present invention.

Hereinafter, embodiments of instrumental analysis data processing method and device according to the present invention will be described with reference to the drawings.

In the following example, an analyzer that performs instrumental analysis is a mass spectrometer, and the obtained measurement data is mass spectrum data. Note that, in the case of a time-of-flight mass spectrometer, a time-of-flight spectrum is first obtained by executing analysis, and a mass spectrum is obtained by converting the time-of-flight into a mass-to-charge ratio. Therefore, data constituting the time-of-flight spectrum before converting the time-of-flight into the mass-to-charge ratio can also be regarded as the mass spectrum data. However, the analyzer to which the present invention can be applied is not limited to this as will be described later.

[First Compression Method]

A principle of a first compression method related to the present invention will be described with reference to FIGS. 3A-3C.

FIG. 3C is an example of a mass spectrum created from mass spectrum data. The horizontal axis represents an m/z value and the vertical axis represents an intensity value, and the mass spectrum data constituting this mass spectrum can be represented by a one-dimensional array of intensity values respectively corresponding to discrete m/z values. That is, for example, assuming that an m/z range is 1 to 2000, a one-dimensional array of m/z values such as (m/z 1, m/z 2, m/z 3, . . . , m/z 1999, m/z 2000) and a one-dimensional array of intensity values such as (0, 123, 3, . . . , 13, 0) corresponding to the m/z values are obtained as the mass spectrum data.

As well known, noise caused by various factors is superimposed on the mass spectrum, and this noise is observed as a minute peak. This minute peak is unnecessary, rather becomes an obstacle, for example, when identifying or quantifying a compound or grasping a two-dimensional intensity distribution of a specific compound in an imaging mass spectrometer. Therefore, as a kind of noise removal process before the compression, an intensity value equal to or lower than a predetermined level is replaced with invalid data. In FIG. 3A, this replaced invalid data is indicated by "*". For example, if an intensity value of "4" or less is defined as invalid, an original intensity value of data indicated by "*" in FIG. 3A is any of "0" to "4". In addition, in a case where an input (ion amount) to a detector of the mass spectrometer is excessive so that an output of the detector is likely to be saturated, an intensity value may also be treated as invalid data when the intensity value is a predetermined upper limit value. That is, the intensity value may be regarded as invalid data not only when the intensity value is small enough to be regarded as noise but also when the intensity value is excessive to exceed a dynamic range of the detector.

When compressing intensity values arrayed in one dimension as illustrated in FIG. 3A, the respective intensity values are checked in order from the start of the array. If one or more significant intensity values are consecutive, information on a consecutive number, which is the number of consecutive significant intensity values, is recorded at the start, and then, an array of the significant intensity values is recorded as it is. Therefore, when n significant intensity values are consecutive, the n intensity values are replaced with an array of n+1 pieces of data. Since there is only one significant intensity value at the start of the array in the example of FIG. 3A, "1" is recorded as a consecutive number at the start by compression, and then, a significant intensity value "15" is recorded as it is. In addition, an array in which three intensity values of "11", "57", and "15" are consecutive is replaced with four pieces of data of "3", "11", "57", and "15".

On the other hand, when invalid intensity values are consecutive, all the invalid intensity values are replaced with one value of one consecutive number of invalid intensity values regardless of the number of the intensity values. Since all pieces of data corresponding to sequence numbers 2 to 14 are invalid data in the example of FIG. 3A, the thirteen pieces of data are collectively replaced with data representing a consecutive number of "13". That is, this significantly reduces the amount of data.

However, it is difficult to distinguish between the consecutive number of invalid data and the consecutive number of significant data simply by performing the above processing. Therefore, when one data is represented by a bit length of two bytes (2×8 bits=16 bits), it is preferable that low-order 15 bits out of the 16 bits represent a numerical value of the consecutive number, and the most significant bit (MSB) be used as an identifier to identify whether it is the consecutive number of significant intensity values or the consecutive number of invalid intensity values. Specifically, it is preferable to define that the low-order 15-bit data represents the consecutive number of significant intensity values or intensity values following the consecutive number when the MSB is "1", and the low-order 15-bit data represents the consecutive number of invalid intensity values when the MSB is "0". In FIG. 3B, "0" is written above the data in which the MSB is "0".

Note that it is possible to generate compressed data with a similar array as a result even if a part of the method described in Patent Literature 1 is used instead of performing compression by the above-described procedure.

Note that it is desirable that a size (bit length) of each data in a compressed data array as described above be the same. Meanwhile, the maximum bit length of an intensity value is determined by an upper limit of the intensity value or a dynamic range, but a value of the consecutive number is determined by the m/z range or an m/z value interval on the m/z value axis, and is likely to be significantly larger than the maximum bit length of the intensity value. Therefore, if one data size is determined in consideration of the maximum bit length of the consecutive number in the compressed data array, a considerable waste is likely to occur. Therefore, for example, a data size of one element on the compressed data array may be set to 8 bits (1 byte), and a plurality of (for example, two) elements may be used for a value indicating a consecutive number is likely to fail in fitting in the data size. As will be described later, a consecutive number is read while confirming data sequentially from the start of the compressed data array at the time of obtaining an intensity value at a specific m/z value from data after compression according to this compression method. Therefore, it is possible to identify a position where the consecutive number is stored next to a certain consecutive number. As a result, it is possible to clearly distinguish between the element in which the significant intensity value itself is stored and the element in which the value of the consecutive number is stored. Therefore, in each part corresponding to the start of data and the storage position of the consecutive number, each bit string of data stored in two consecutive elements can be combined as the high-order bit and the low-order bit and handled as information indicating the consecutive number of 16 bits.

In addition, the intensity value of the mass spectrum may be floating-point type data instead of integer type data. For example, if an intensity value is stored as 32-bit floating-point type data, a data size of a compressed array is also 32 bits, and it is preferable to treat only the element storing a consecutive number as a 32-bit integer type.

[Method for Acquiring Intensity Value Corresponding to Specific m/z Value from Compressed Data by First Compression Method]

FIGS. 4A-4B are views illustrating a schematic procedure at the time of obtaining an intensity value corresponding to a specific m/z value from data after compression by the first data compression method described above.

When the specific m/z value for which the intensity value is desirably obtained is specified, a position of the intensity value at the specific m/z value on an uncompressed data array, that is, a sequence number can be determined from the above-described information on the array of m/z values. In this example, it is assumed that the sequence number indicating the position of the target intensity value on uncompressed data array is "16" as indicated by the arrow in FIG. 4A.

On the compressed data array illustrated in FIG. 4B, values indicating consecutive numbers are found in order from the start, and the consecutive numbers are sequentially added. Specifically, since data at the start is always a consecutive number and a value of this consecutive number is "1", it can be seen that data indicating the next consecutive number is located at the third position. Therefore, a consecutive number "13" illustrated at the third data is added to the first consecutive number "1". Since this consecutive number is the consecutives number of invalid data, the next fourth data represents a consecutives number of significant data. Therefore, if a consecutive number "3" illustrated at the fourth data is further added, the addition result is "17", which exceeds a sequence number "16" in which the target intensity value exists on the uncompressed data array. Therefore, the target intensity value exists among three intensity values following the position where the consecutive number, which has been added last, is stored at this point in time.

Since an immediately previously added value of the consecutive numbers is "14", it can be seen that the three intensity values following the consecutive number "3" of significant intensity values have sequence numbers "15", "16", and "17" on the uncompressed data array. Therefore, it is preferable to select an intensity value "57" (indicated by the underlined arrow in FIG. 4B) at the position where the sequence number is "16" and to output this intensity value as the intensity value corresponding to the specific m/z value which is the target.

In this manner, the consecutive numbers are found and added in order from the start of the compressed data array, and the target intensity value can be found from the addition result and the sequence number on the uncompressed data array. Therefore, it is possible to quickly find the intensity value corresponding to the specific m/z value which is the target without decompressing the compressed data to be returned to the original data.

[Configuration of Imaging Mass Spectrometry System of First Embodiment Adopting First Compression Method]

FIG. 1 is a schematic configuration diagram of an imaging mass spectrometry system of a first embodiment using the above-described first compression method for data storage.

This imaging mass spectrometry system includes: an imaging mass spectrometer unit 1 that executes mass spectrometry on a large number of measurement points in a two-dimensional area on a sample to acquire mass spectrum data; a data processor 2 that performs data processing such as data compression; a data storage 3 that stores data compressed by the data processor 2; an operation unit 4 to be operated by a user; and a display unit 5 that displays an analysis result and the like. The data processor 2 is actually a personal computer and includes a spectrum data collector 20, a main memory 21, a data compressor 22, a data decompressor 23, a data reader 25, an image creator 26, and the like as functional blocks. In addition, the data storage 3 has a compressed data memory area 30.

The spectrum data collector 20 reads mass spectrum data obtained for each measurement point in an imaging mass spectrometer unit 1 and temporarily stores the data in the main memory 21 or an external auxiliary storage device (such as a hard disk, which is not illustrated) or in an area of the data storage 3 other than the illustrated memory area 30. The data compressor 22 compresses each piece of the mass spectrum data corresponding to the respective measurement points according to the first compression method described above and stores the compressed data in the compressed data memory area 30 of the data storage 3. For example, in a case of reproducing and displaying a mass spectrum from compressed data at a specific measurement point, the data decompressor 23 reads the compressed data corresponding to the measurement point specified through the operation unit 4 from the data storage 3, performs a decompression process opposite to a process during the compression to reproduce the mass spectrum and display the reproduced mass spectrum on a screen of the display unit 5. However, the mass spectrum reproduced by the decompression process is not the mass spectrum itself obtained by the measurement since a signal at a level that is invalid is removed in the above-described compression method.

For example, when an instruction is made through the operation unit 4 to display an image at a specific m/z value, the data reader 25 reads compressed data from the data storage 3 and acquires an intensity value corresponding to the m/z value specified at each measurement point. At this time, the target intensity value can be read without performing the decompression process by the procedure described above and described later. The image creator 26 creates an image based on the intensity value at each measurement point and displays the created image on the screen of the display unit 5. Since a one-dimensional array of m/z values is common to all the measurement points, the sequence number corresponding to the specific m/z value is the same on the uncompressed data array. Therefore, the target intensity value can be quickly read for each measurement point, and the image at the specific m/z value can be created in a short time.

[Detailed Processing when Intensity Value Corresponding to Specific m/z Value is Obtained]

FIG. 7 is a flowchart illustrating detailed processing performed by the data reader 25 when an intensity value at a specific m/z position is obtained in the imaging mass spectrometry system of the first embodiment. Here, S is a sequence number in which data for which the intensity value is desirably obtained is located on the uncompressed data array. This is known from the information on the one-dimensional array of m/z values. U is a variable indicating a sequence number on the uncompressed data array currently of interest. In addition, P is a variable indicating a sequence number on the compressed data array currently of interest.

Note that, in order to illustrate an order of data on a data array in an easy-to-understand manner, sequence numbers are assigned such that 1, 2, and so on from the start of the array in FIGS. 5, 6, 14, and 15, which will be described later, in addition to FIGS. 3 and 4 used for the description of the principle of compression. As well known, however, in the field of digital signal processing using a computer or the like, it is general that the processing is performed assuming that a number of the start data is 0 in the case of processing data with serial numbers as described above. Even in the device of the present embodiment, the processing is performed assuming that a sequence number of data at a start position on the data array is 0 inside the device or in software. Therefore, in the following flowcharts illustrated in FIGS. 7 to 12, it is assumed that a sequence number of data at a start position of a data array is 0 in response to the internal processing of the actual device. Therefore, sequence number in these flowcharts is obtained by subtracting 1 from the sequence number in FIGS. 3 to 6, 14, and 15.

First, the variable U is set to 0 which is an initial value as the initial setting (Step S101). In addition, the variable P is set to the start position of the compressed data array (that is, "1") (Step S102). Next, a value V of data at a position of the variable P is acquired (Step S103), and whether the MSB of this value V is "1" is determined (Step S104). If the MSB is "1", the value V indicates the consecutive number of significant intensity values. Therefore, if the MSB is "1" (Yes in S104), a value represented by the remaining bits excluding the MSB from the value V is added to a value of the variable U at that time (Step S105). On the other hand, if it is determined as No in Step S104, the MSB of the value V is "0", which means that the value V is the consecutive number of invalid intensity values. Therefore, the value V is directly added to the value of the variable U at that time (Step S109). In practice, however, the result is the same even if the value V is added while excluding the MSB in Step S109.

Since the variable U is set to 0 in Step S101, the value added in S105 or S109 becomes the value of the variable U as it is when either process in Step S105 or S109 is executed for the first time. In the example illustrated in FIGS. 4A-4B, when Step S104 is executed for the first time, it is determined as Yes in S104, and the value of the variable U changes from "0" to "1" in the process of the next Step S105.

After the execution of Step S105, a value, obtained by adding 1 to a value represented by the remaining bits excluding the MSB from the value V, is added to the value of the variable P. As a result, a current position of the data of interest on the compressed data array moves forward (Step S106). In the example illustrated in FIGS. 4A-4B, the value represented by the remaining bits excluding the MSB from the value V is "1", and thus, the position of the data of interest on the compressed data array moves forward to the third position by "2", which is obtained by adding 1 to the above value and 1. This means skipping, that is, non-observing of data indicating the significant intensity value. Then, whether the value of the variable U is larger than the target sequence number S is determined (Step S107), and if it is determined as No, the processing returns from Step S107 to S103.

Meanwhile, the value of the variable P is increased by 1 after the execution of Step S109 since the data following the data indicating the consecutive number of the invalid data is the data indicating the consecutive number of significant intensity values. As a result, a current position of the data of interest on the compressed data array is moved forward by 1 (Step S110). Thereafter, whether the value of the variable U is larger than the target sequence number S is determined in the same manner as in Step S107 (Step S111), and it is determined as No, the processing returns from Step S111 to S103. Upon returning from Step S107 or S111 to S103, the above-described processes of Steps S103 to S107 and S109 to S111 are repeated. As a result, it is possible to search for the position of the data of the target sequence number while selecting only the data indicating the consecutive number on the compressed data array.

When it is determined as Yes in Step S107, the consecutive number at this time is the consecutive number of significant intensity values. At this time, a value of data at a position, returned by [value of variable U—target sequence number S], from the position indicated by the variable P at that time on the compressed data array is acquired. That is, the intensity value at the position corresponding to the target sequence number is acquired out of the array of significant intensity values recorded subsequently to the consecutive number when it is determined as Yes in Step S107. Then, the acquired value is output as the intensity value corresponding to the target m/z value (Step S108).

Meanwhile, if it is determined as Yes in Step S111, the consecutive number at that time is the consecutive number of invalid intensity values. At this time, a value defined as the invalid value is unconditionally output as the intensity value corresponding to the target m/z value (Step S112).

As described above, the intensity value corresponding to the target specific m/z value can be acquired without decompressing the compressed data.

[Processing when Acquiring Integrated Intensity Value Corresponding to Specific m/z Range]

Figure 8:
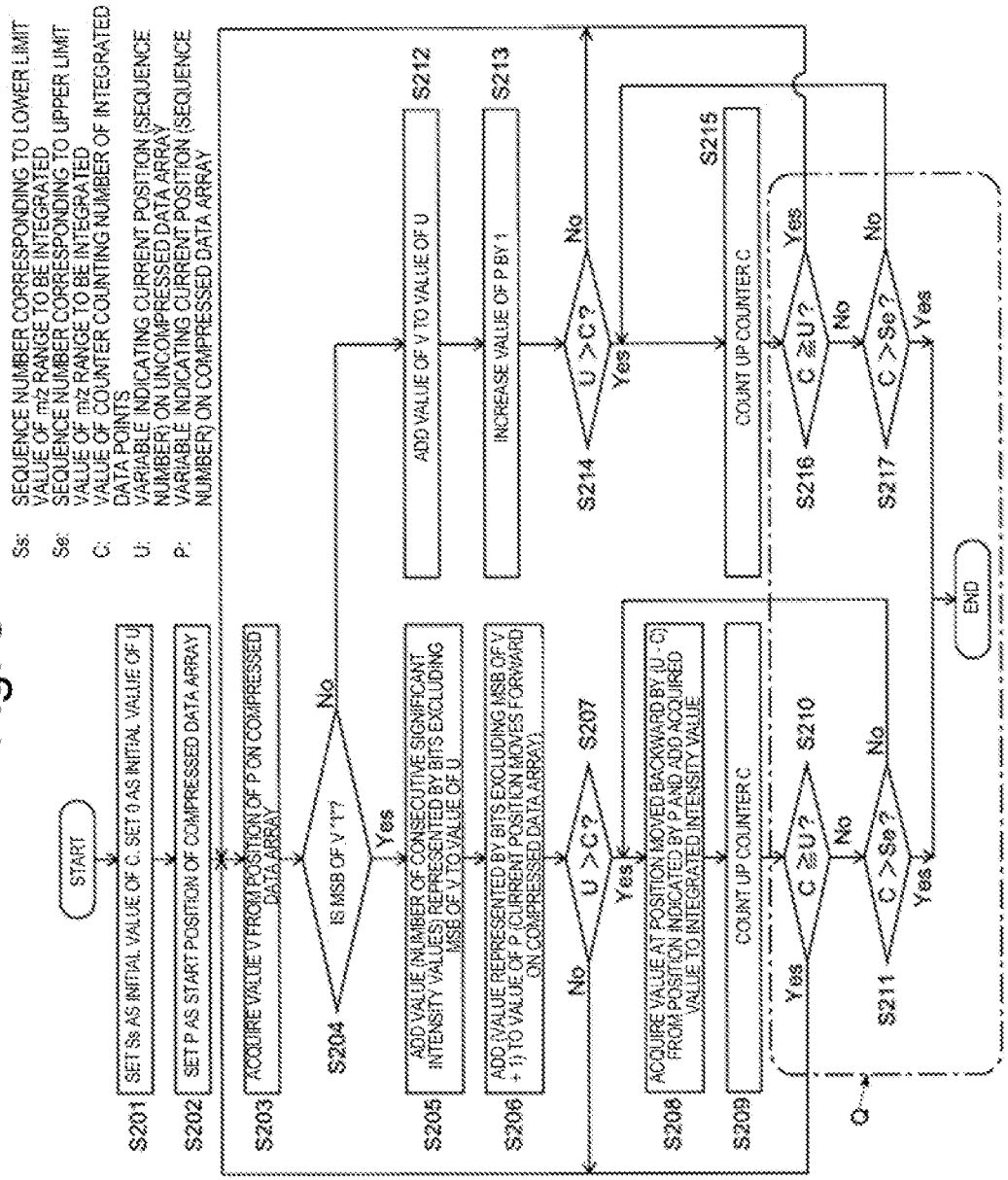
FIG. 8 is a flowchart illustrating a processing flow when an integrated intensity value in a specific m/z range is obtained from the compressed data in the first data compression method.

There is a case where it is desired to create an image of an integrated intensity value obtained by integrating a plurality of intensity values included in a specific m/z range instead of one specific m/z value when displaying the image. FIG. 8 is the flowchart illustrating detailed processing performed by the data reader 25 when acquiring the integrated intensity value obtained by integrating the plurality of intensity values included in the specific m/z range.

Here, Ss is a sequence number in which data of an intensity value corresponding to a lower limit of the m/z range to be integrated is located on the uncompressed data array, and Se is a sequence number in which data of an intensity value corresponding to an upper limit of the m/z range to be integrated is similarly located. These are known from the information on the one-dimensional array of m/z values. In addition, C is a count value of a counter that counts the number of integrated data points. In addition, U and P are a variable indicating a sequence number on the uncompressed data array currently of interest and a variable indicating a sequence number on the compressed data array currently of interest.

First, the count C of the counter is set to the sequence number Ss of the lower limit, and the variable U is set to 0 (Step S201). A process in each step of the subsequent Steps S202 to S207 and S212 to S214 is the same as the process in each step of Steps S102 to S107 and S109 to S111 in FIG. 7 (except that a target to be compared with the variable U in Steps S207 and S214 is changed to the count value of the counter C), and thus, will not be described.

When it is determined as Yes in Step S207, a value of data at a position, returned by [value of variable U—target sequence number S], from the position indicated by the variable P at that time on the compressed data array is acquired. That is, the intensity value at the position corresponding to the target sequence number is acquired out of the array of significant intensity values recorded subsequently to the consecutive number when it is determined as Yes in Step S207. Then, this acquired value is added to an integrated intensity value (Step S208). Thereafter, the count C of the counter is counted up by 1 (Step S209). Then, whether the count C is equal to or larger than the value of the variable U is determined (Step S210), and if it is determined as Yes, the processing returns from Step S210 to S203. If it is determined as No in Step S210, whether the count C exceeds the sequence number Se of the upper limit is determined (Step S211), and if it is determined as No, the processing returns to Step S208. If it is determined as Yes in Step S211, all the intensity values to be integrated have been integrated, and thus, the processing is ended.

Meanwhile, if it is determined as Yes in Step S214, the count C of the counter is counted up by 1 as it is, that is, without performing integration (Step S215). Then, whether the count C is equal to or larger than the value of the variable U is determined (Step S216), and if it is determined as Yes, the processing returns from Step S216 to S203. If it is determined as No in Step S216, whether the count C exceeds the sequence number Se of the upper limit is determined (Step S217), and if it is determined as No, the processing returns to Step S215. If it is determined as Yes in Step S217, all the intensity values to be integrated have been integrated, and thus, the processing is ended.

As described above, it is possible to obtain the integrated intensity value, obtained by integrating the plurality of intensity values corresponding to the target specific m/z range, without decompressing the compressed data.

The sequence number corresponding to the specific m/z value using the information of the one-dimensional array of m/z values or the sequence numbers respectively corresponding to the lower limit and the upper limit of the specific m/z range are obtained to create and display the image with the specific m/z value or the specific m/z range. Then, the intensity value corresponding to the specific m/z value as the target or the integrated intensity value corresponding to the specific m/z range as the target is acquired according to the above procedure from the compressed data array in which each mass spectrum data at each measurement point has been compressed. Then, the image is created based on the intensity value or the integrated intensity value at the plurality of measurement points, and this image is displayed on the screen of the display unit 5.

[Second Compression Method]

Next, a principle of a second compression method related to the present invention will be described with reference to FIGS. 5A-5B.

The above-described first compression method is a compression method that does not use an index, and thus, is advantageous for reducing the amount of data. When acquiring an intensity value corresponding to a specific m/z value, however, it is necessary to add the consecutive numbers in order from the start of the compressed data array, and it takes time to acquire an intensity value in a high m/z area in mass spectrum data with a wide m/z range in some cases. This point is improved by the second compression method.

In an array of intensity values in original mass spectrum data, pre-processing is performed such that data whose intensity value level is equal to or lower than a predetermined value is regarded as invalid data, which is similar to the first compression method. FIG. 5A is an example of an uncompressed data array after such pre-processing. What is characteristic is that this uncompressed data array is not directly compressed, but the uncompressed data array is divided into blocks including a certain number of pieces of data and compression is performed independently for each block. In the example of FIGS. 5A-5B, the data array is divided such that each block includes 1000 pieces of data.

Each block divided as described above is independently compressed by the same procedure as in the first compression method. That is, if significant intensity values are consecutive in order from data at the start of each block, the consecutive number is arranged at the start, and then, an array of the intensity values is arranged. As a result, n consecutive significant intensity values are replaced with an array of (n+1) pieces of data. On the other hand, if invalid intensity values are consecutive, the consecutive invalid intensity values are replaced with data indicating one consecutive number regardless of the number of the invalid intensity values. As a result, for example, an array constituted by 1000 pieces of data included in one block illustrated in FIG. 5A is replaced with seven pieces of data.

In addition, a one-dimensional array is created by collecting sequence numbers at positions of start data in the respective block on the compressed data array, and the one-dimensional array is stored as index information together with the compressed data array. In the example of FIGS. 5A-5B, the sequence numbers of the start data in the respective blocks are "1" and "8", and thus, these become the index information. Since this compression method divides the uncompressed data array into blocks, for example, consecutive invalid intensity values are divided into two blocks, and accordingly, the compression efficiency is likely to decrease as compared with the first compression method. In addition, since the index is created, the amount of data also increases by the amount of the index, and the compression efficiency is likely to decrease in terms of this respect as well. However, the actual increase in the amount of data is not so large as compared with the first compression method and is sufficiently acceptable as will be described later.

[Method for Acquiring Intensity Value Corresponding to Specific m/z Value from Compressed Data by Second Compression Method]

FIGS. 6A-6B are views illustrating a schematic procedure at the time of obtaining an intensity value corresponding to a specific m/z value from data after compression by the second data compression method described above.

When the specific m/z value for which the intensity value is desirably obtained is specified, a position of the intensity value at the specific m/z value on an uncompressed data array, that is, a sequence number can be determined from the above-described information on the array of m/z values. In this example, it is assumed that the sequence number indicating the position of the target intensity value on uncompressed data array is "1003" as indicated by the arrow in FIG. 6A.

An index is first used at the time of searching for an intensity value whose sequence number on the uncompressed data array is "1003" on a compressed data array illustrated in FIG. 6B. That is, the index stores information on a position of the start of each block on the compressed data array. Therefore, when a value, obtained by subtracting 1 from the sequence number on the one-dimensional array in the index, is multiplied by the number of pieces of uncompressed data per block (1000 in this case) and then 1 is added to the multiplication result, the sequence number at the start of each block on the uncompressed data array can be obtained. In the example of FIGS. 6A-6B, "8" is stored as index information at the position where the sequence number is "2" on the one-dimensional array in the index. When a value obtained by subtracting 1 from this sequence number "2" is multiplied by 1000 and 1 is added to the resultant value, "1001" is obtained. Therefore, it can be seen that the sequence number "8" on the compressed data array corresponds to the sequence number "1001" on the uncompressed data array. Therefore, it is preferable to search for the intensity value corresponding to the target m/z value by the reading method used in the first compression method while associating the data with the sequence number "8" on the compressed data array with the data corresponding to the sequence number "1001" on the uncompressed data array.

In the example of FIGS. 6A-6B, it can be seen that the data with the sequence number "8" on the compressed data array indicates the consecutive number of the invalid data since the MSB is "0". Since this consecutive number is "4", the sequence number "1003" on the uncompressed data array is included in the invalid data. Therefore, it can be seen that the data with the sequence number "1003" on the uncompressed data array is the invalid intensity value. In this manner, it is preferable to start the work of reading and adding the information on the number of consecutive invalid intensity values and the number of consecutive significant intensity values by finding the start position of each block using the index, from the start of the block including the data corresponding to the target m/z value. That is, in this case, the above work is preferably performed only on the compressed array corresponding to the maximum of 1000 pieces of uncompressed data, and the search time can be shortened as compared with the case where the above work is performed in order from the start of the entire compressed data array.

The index is added in the second compression method, and the index is used at the time of searching for the target intensity value in the above processing, but the target intensity value can be read by the same method as in the data processing for the compressed data according to the first compression method without using the index. In this manner, when only the compressed data part excluding the index is used, it is difficult to increase the speed by processing in the minimum required block using the index, but there is an advantage that the processing compatibility can be ensured between data processing after performing the normal decompression and data processing for the compressed data using the first compression method. As a result, even if the device is equipped with only software configured to perform data processing on the compressed data according to the first compression method, for example, it is possible to perform the minimum required processing for the analysis of imaging mass spectrometric data, for example, by acquiring the intensity value corresponding to the target m/z value from the compressed data according to the second compression method or the like. In addition, even in a situation where the stored index information is damaged and is not readable, the required data processing can be performed.

[Configuration of Imaging Mass Spectrometry System of Second Embodiment]

FIG. 2 is a schematic configuration diagram of an imaging mass spectrometry system of a second embodiment using the above-described second compression method for data storage.

In this imaging mass spectrometry system, the same or corresponding components as those in the imaging mass spectrometer of the first embodiment are denoted by the same reference signs, and will not be described. In this imaging mass spectrometry system, the data processor 2 is mounted with an index creator 24, and the data storage 3 is provided with an index memory area 31.

The spectrum data collector 20 reads mass spectrum data obtained for each measurement point in an imaging mass spectrometer unit 1 and temporarily stores the data in the main memory 21 or an external auxiliary storage device (such as a hard disk, which is not illustrated) or in an area of the data storage 3 other than the illustrated memory area 30. The data compressor 22 divides the mass spectrum data for each measurement point into a plurality of blocks including a predetermined number of pieces of data according to the above-described second compression method, and then, performing compression per block to store the compressed data in the compressed data memory area 30 of the data storage 3. In addition, the index creator 24 collects position information of starts of the blocks as described above for each compression performed in units of blocks by the data compressor 22 to create an index. Then, the created index is stored in the index memory area 31 of the data storage 3.

For example, in a case of reproducing and displaying a mass spectrum from compressed data at a specific measurement point, the data decompressor 23 reads the compressed data corresponding to the measurement point specified through the operation unit 4 and an index corresponding to the compressed data from the data storage 3, performs a decompression process opposite to a process during the compression to reproduce the mass spectrum and display the reproduced mass spectrum on a screen of the display unit 5. In addition, for example, when an instruction is made through the operation unit 4 to display an image at a specific m/z value, the data reader 25 reads compressed data and an index corresponding to the compressed data from the data storage 3 and acquires an intensity value corresponding to the m/z value specified at each measurement point. At this time, the target intensity value can be read without performing the decompression process by the procedure described above and described later. The image creator 26 creates an image based on the intensity value at each measurement point and displays the created image on the screen of the display unit 5.

[Detailed Processing when Intensity Value Corresponding to Specific m/z Value is Obtained]

Figure 9:
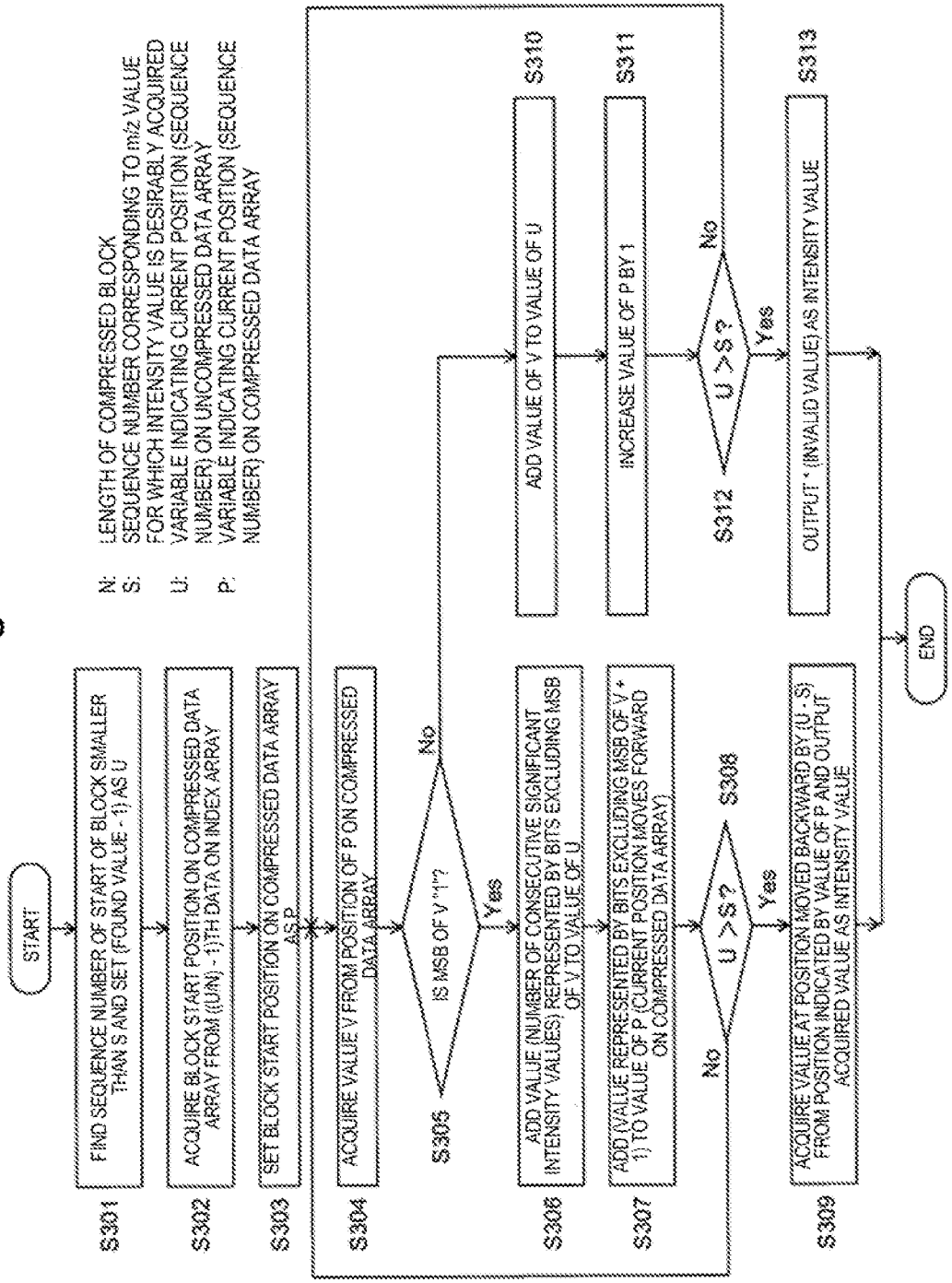
FIG. 9 is a flowchart illustrating a processing flow when the intensity value at the specific m/z position is obtained from the compressed data in the second data compression method.

FIG. 9 is a flowchart illustrating detailed processing performed by the data reader 25 when an intensity value at a specific m/z position is obtained in the imaging mass spectrometry system of the second embodiment. Here, S, U, and P have the same definitions as those already described with reference to FIG. 7. N is the number of pieces of data in one block before compression. In the examples of FIGS. 5 and 6, N=1000.

First, a sequence number at the start of the block, which is smaller than the sequence number S, is found using the sequence number S on the uncompressed data array corresponding to the m/z value for which the intensity value is desirably confirmed and the index. Then, a value obtained by subtracting 1 from the sequence number is set as the initial value of the variable U (Step S301). As described above, when the sequence number of the target m/z value is "1003", the value of the variable U is 1000. Next, the sequence number at the start of the block in the compressed data array ("8" in the examples of FIGS. 5 and 6) is acquired from the ((U/N)+1)th data on the array of the index (Step S302).). Then, this acquired value is set as the variable P (Step S303). With the processes of Steps S301 to S303, the start position to begin reading the consecutive number on the compressed data array is determined.

Since each process of Steps S304 to S313 is basically the same as each process of Steps S103 to S112 illustrated in FIG. 7, its detailed description will be omitted. That is, a difference from the processing for the compressed data according to the first compression method is that an initial value at the time of searching for an array number of an intensity value corresponding to a specific m/z value as a target is the start of the entire array of compressed data or the start of a block including the intensity value corresponding to the m/z value. In this case, the search range is limited to one block, and thus, the target intensity value can be acquired in a short time.

[Processing when Acquiring Integrated Intensity Value Corresponding to Specific m/z Range]

Figure 10:
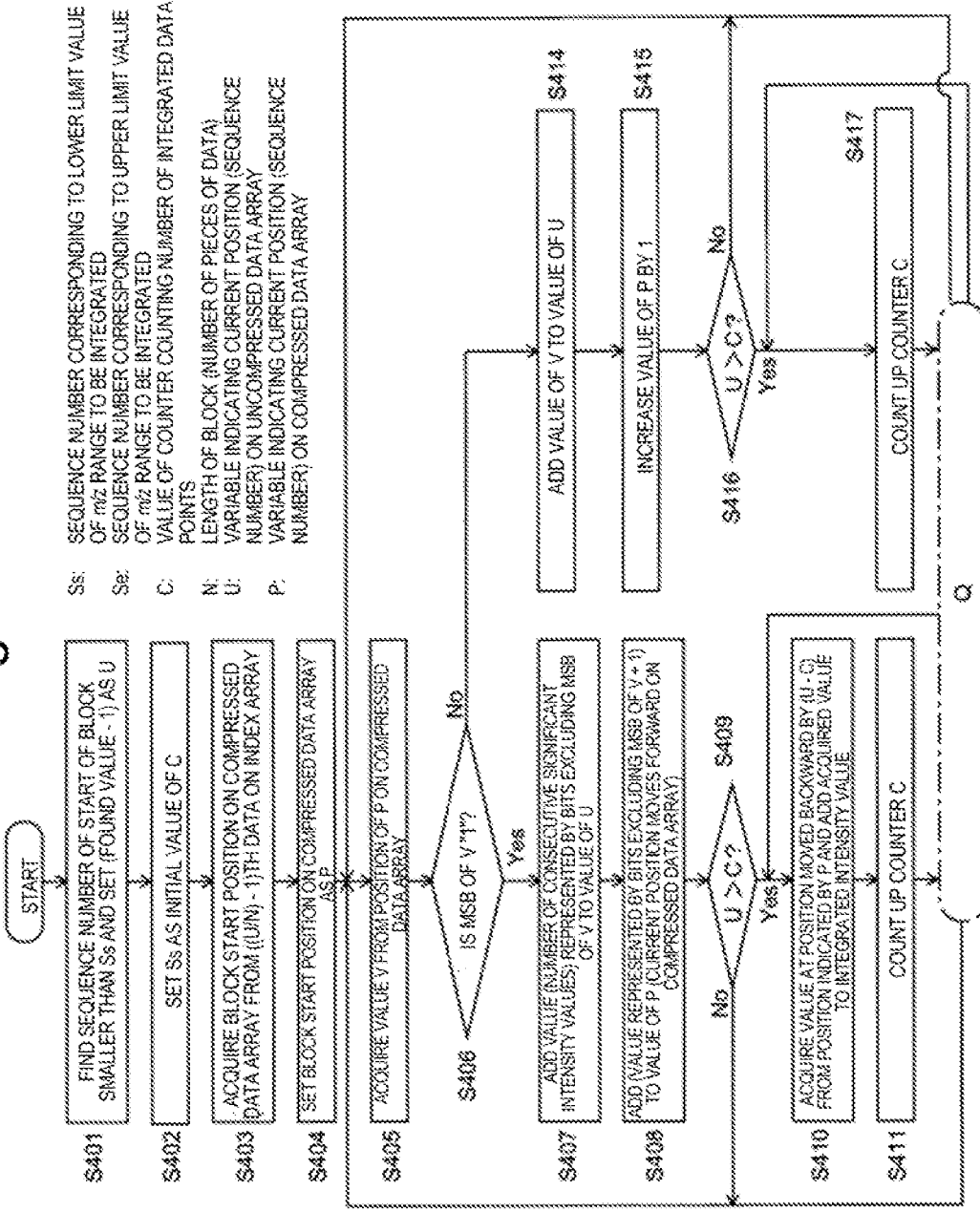
FIG. 10 is a flowchart illustrating a processing flow when an integrated intensity value in a specific m/z range is obtained from the compressed data in the second data compression method.

FIG. 10 is a flowchart illustrating detailed processing performed by the data reader when acquiring an integrated intensity value obtained by integrating a plurality of intensity values included in a specific m/z range in the imaging mass spectrometry system of the second embodiment. The definitions of Ss, Se, N, C, U, and P are the same as those described above. In addition, the part indicated by Q in FIG. 10 is the same as the steps indicated by Q in FIG. 8.

First, a sequence number at the start of the block, which is smaller than the sequence number Ss, is found using the sequence number Ss on the uncompressed data array corresponding to the lower limit of the m/z range for which the intensity value is desirably confirmed and the index. Then, a value obtained by subtracting 1 from the sequence number is set as the initial value of the variable U (Step S401). A count C of a counter is set to the sequence number Ss of the lower limit (Step S402). Next, the sequence number at the start of the block in the compressed data array is acquired from the ((U/N)+1)th data on the array of the index (Step S403). Then, this acquired value is set as the variable P (Step S404). With the processes of Steps S401 to S404, the start position to begin reading the consecutive number on the compressed data array is determined.

Processes in the subsequent Steps S405 to S411, S414 to S417, and in the respective steps included in Q are the same as the processes in the respective steps of Steps S203 to S217 in FIG. 8, and thus, will not be described. Even in this case, the block for searching the intensity value corresponding to the target m/z range is limited, and thus, the target integrated intensity value can be acquired in a short time.

The sequence number corresponding to the specific m/z value using the information of the one-dimensional array of m/z values or the sequence numbers respectively corresponding to the lower limit and the upper limit of the specific m/z range are obtained to create and display the image with the specific m/z value or the specific m/z range. Then, the intensity value corresponding to the specific m/z value as the target or the integrated intensity value corresponding to the specific m/z range as the target is acquired according to the above procedure from the compressed data array in which each mass spectrum data at each measurement point has been compressed. Then, the image is created based on the intensity value or the integrated intensity value at the plurality of measurement points, and this image is displayed on the screen of the display unit 5.

[Process of Creating Data Matrix Used for Multivariate Analysis, Etc.]

In general, when performing multivariate analysis such as principal component analysis on multiple mass spectrum data, the analysis is often performed on peak intensity information created by extracting significant peak information (m/z value and intensity) from profile data rather than using the entire profile data for analysis. For example, a peak on a mass spectrum is formed of a plurality of data points. In many cases, one peak is represented by one intensity value by integrating intensity values of data points within a specific allowable range from the center (center of gravity) of the peak, calculating an area value (integral value) in consideration of the m/z value on the horizontal axis, or obtaining an average intensity value obtained by dividing the area value by a width of the peak, and the multivariate analysis is performed on a data matrix in which the intensity values are arranged in a matrix. As one intensity value representing the peak, an intensity value of a peak top is also simply used in some cases.

In any case, the following procedure is preferably performed when creating the above data matrix from the compressed data array.

(1) Creation of m/z Value List

First, the maximum intensity spectrum created by extracting a signal with the maximum intensity for each m/z value is obtained for an average spectrum obtained by averaging all or some of a plurality of mass spectra to be analyzed or the plurality of mass spectra. Then, an m/z range of each peak observed on this spectrum is examined, and a list of m/z values corresponding to a start point and an end point of each peak is created. The m/z range of the peak is preferably set to, for example, an m/z range in which an intensity value exceeds a predetermined threshold among a plurality of pieces of data constituting the peak on the mass spectrum. Alternatively, an allowable width may be provided before and after a peak top and a position of the center of gravity, and a range of the allowable width may be regarded as the m/z range of the peak to determine the start point and the end point of the peak. In addition, in order to reduce the amount of data used for analysis, a final list of m/z values may be created by extracting only peaks whose intensity values are equal to or higher than a predetermined value on the mass spectrum in a provisional peak list created as described above. In addition, the list of m/z values may be created based on theoretical mass values of a plurality of compounds and past measured values.

(2) Calculation of Intensity Value Information of Data Matrix

As the intensity value, which is each element of the data matrix, any of the following integrated intensity value, peak top intensity value, and centroid intensity value can be used.

(A) Integrated (Averaged) Intensity Value

Based on the m/z range list created as described above, an integrated intensity value corresponding to each m/z range in the list is obtained from the compressed data array for the plurality of mass spectra to be analyzed. When calculating the integrated intensity value in each m/z range in the list from each mass spectrum, it is preferable to repeatedly perform the above-described intensity value integration process. In addition, in the course of integrating the intensity values, a difference in m/z values between adjacent data points on the m/z value axis may be multiplied by the intensity value to obtain an area value. In addition, an average value obtained by dividing the integrated value by the number of integrated data points may be used as one intensity value representing each peak.

(B) Peak Top Intensity Value

Figure 11:
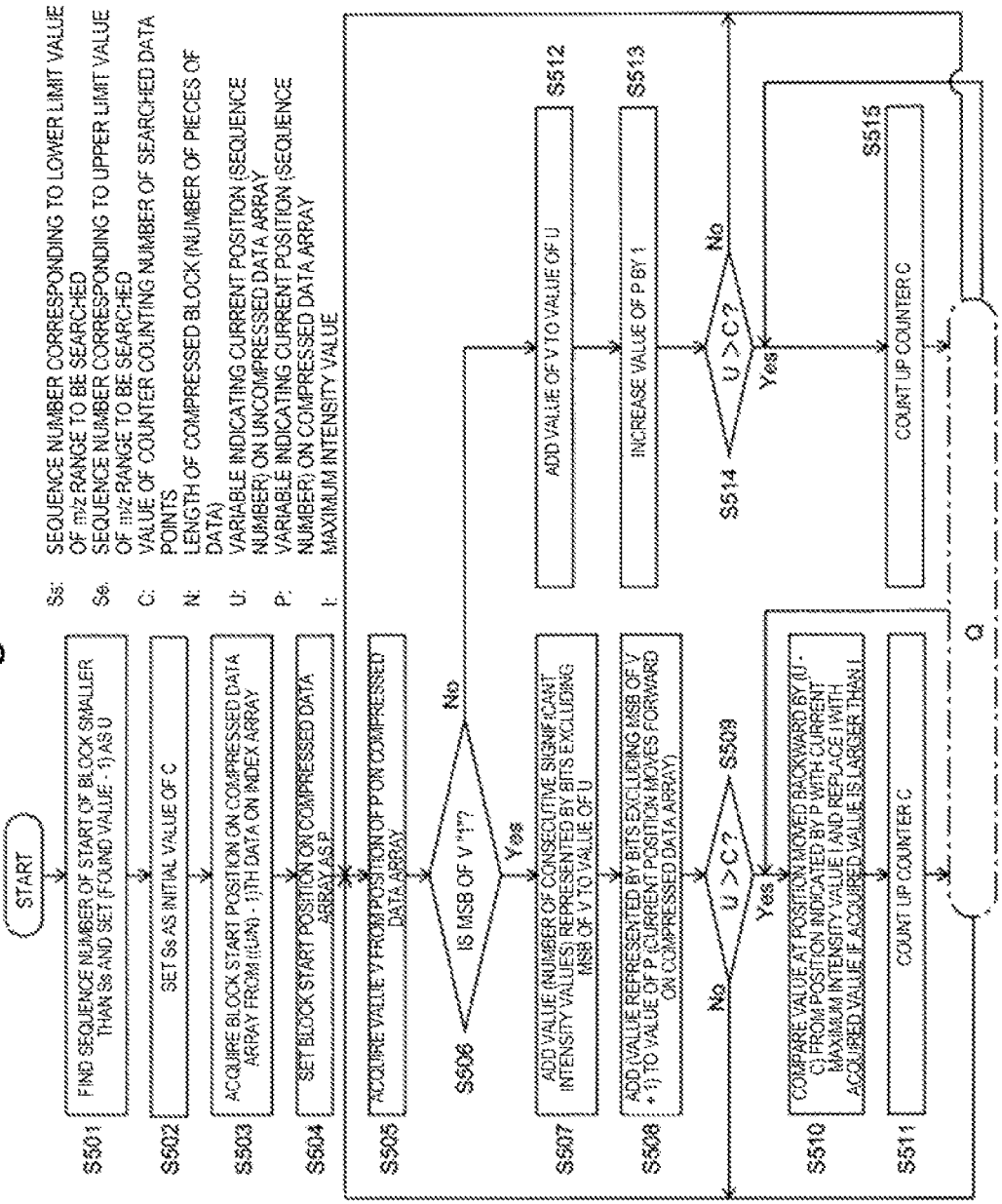
FIG. 11 is a flowchart illustrating a processing flow when a data matrix for multivariate analysis or the like is created from the compressed data in the second data compression method.

When using the peak top intensity value as one intensity value representing the peak, the maximum value calculation process as follows is preferably performed for each m/z range in the list in the respective mass spectra to acquire the peak top intensity value of a peak included in each m/z range. FIG. 11 is a flowchart illustrating detailed processing performed by the data reader 25 when acquiring a peak top intensity value of one peak included in the m/z range in the imaging mass spectrometry system of the second embodiment. The definitions of Ss, Se, N, C, U, and P are the same as those described above. However, here, Ss and Se are not upper and lower limits of the m/z range for integration of the intensity values, but upper and lower limits of the m/z range for searching for the maximum intensity. In addition, I is the maximum intensity value. Note that the part indicated by Q in FIG. 11 is the same as the steps collectively indicated by Q in FIG. 8.

Basically, a process of each step in FIG. 11 is almost the same as the process of each step in FIG. 10. A difference is that the acquired intensity values are integrated in Step S410 in FIG. 10, but the acquired intensity value is compared with the maximum intensity value I obtained so far and the maximum intensity value I is replaced with a new intensity value if the newly acquired intensity value is larger in Step S510 in FIG. 11. Therefore, the maximum intensity value in the m/z range that needs to be searched, that is, the peak top intensity value is acquired in the processing illustrated in FIG. 11.

(C) Centroid Intensity Value

When creating the data matrix, centroid data in which the m/z value of the center of gravity of the peak and the area value are associated as a set, or the m/z value of the peak top and the intensity value of the peak top are associated as a set is obtained as information on all the peaks of the respective mass spectra in advance. Then, an intensity value of a centroid included in the m/z range listed in the m/z value list for which the data matrix is to be created may be used as the intensity value of the data matrix based on each centroid data.

(3) Creation of Data Matrix by Binning

The above data matrix is a data matrix in which one intensity value corresponds to one peak, but a data matrix may be created by dividing the m/z axis of the mass spectrum into a plurality of consecutive sections regardless of the presence or absence of peaks, instead of the units of peaks, and associating one intensity value with each section. Such processing is called binning (strictly speaking, binning on m/z). In the binning, the width of the m/z value of each section is not necessarily equal, and thus, for example, a section may be narrowed in a portion where a significant peak exists, and a section may be widened in a portion where no significant peak exists. For one intensity value corresponding to one section, an integrated value of intensity values within a range of the section can be used.

Figure 12:
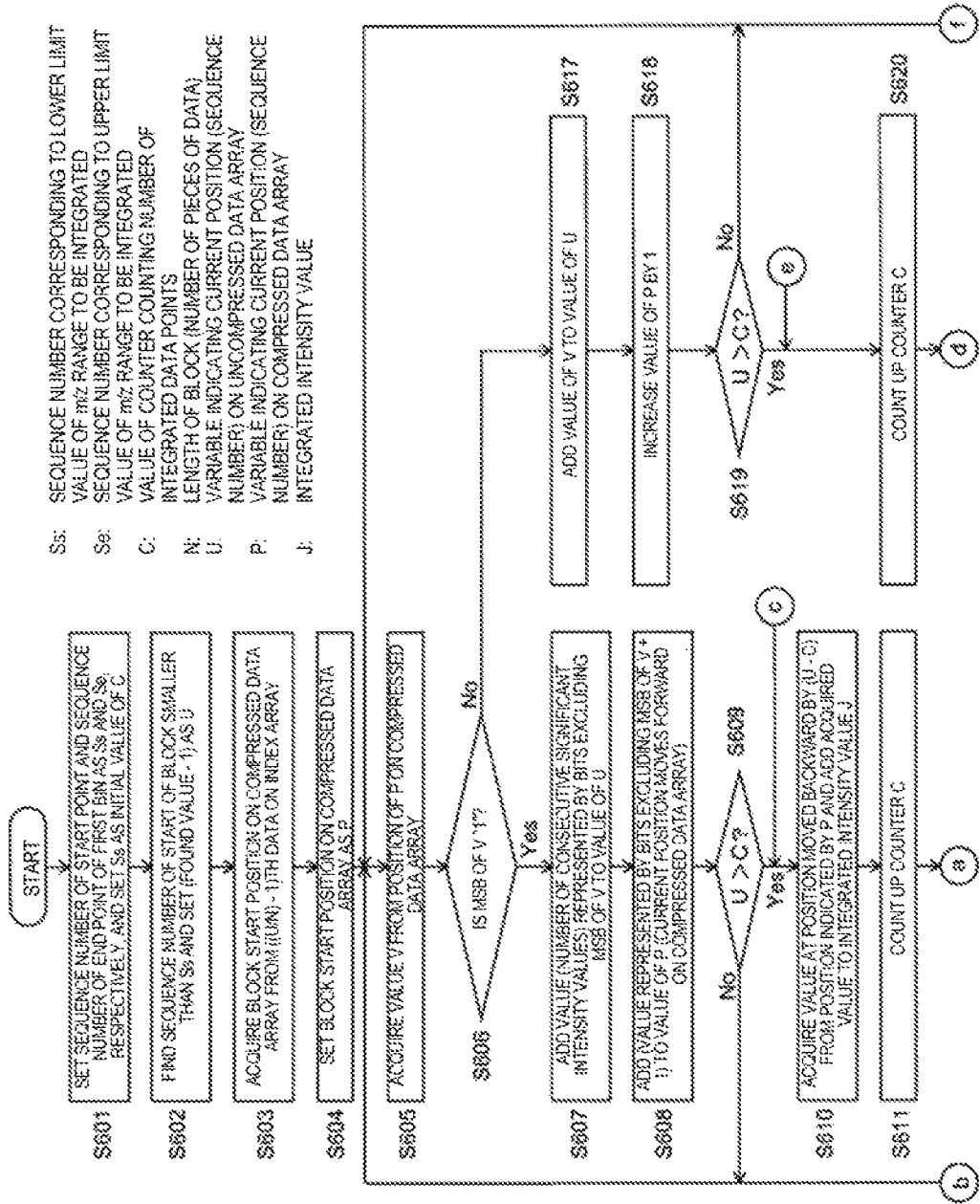
FIG. 12 is a flowchart illustrating a processing flow when a data matrix binned on an m/z axis is created from the compressed data in the second data compression method.
Figure 13:
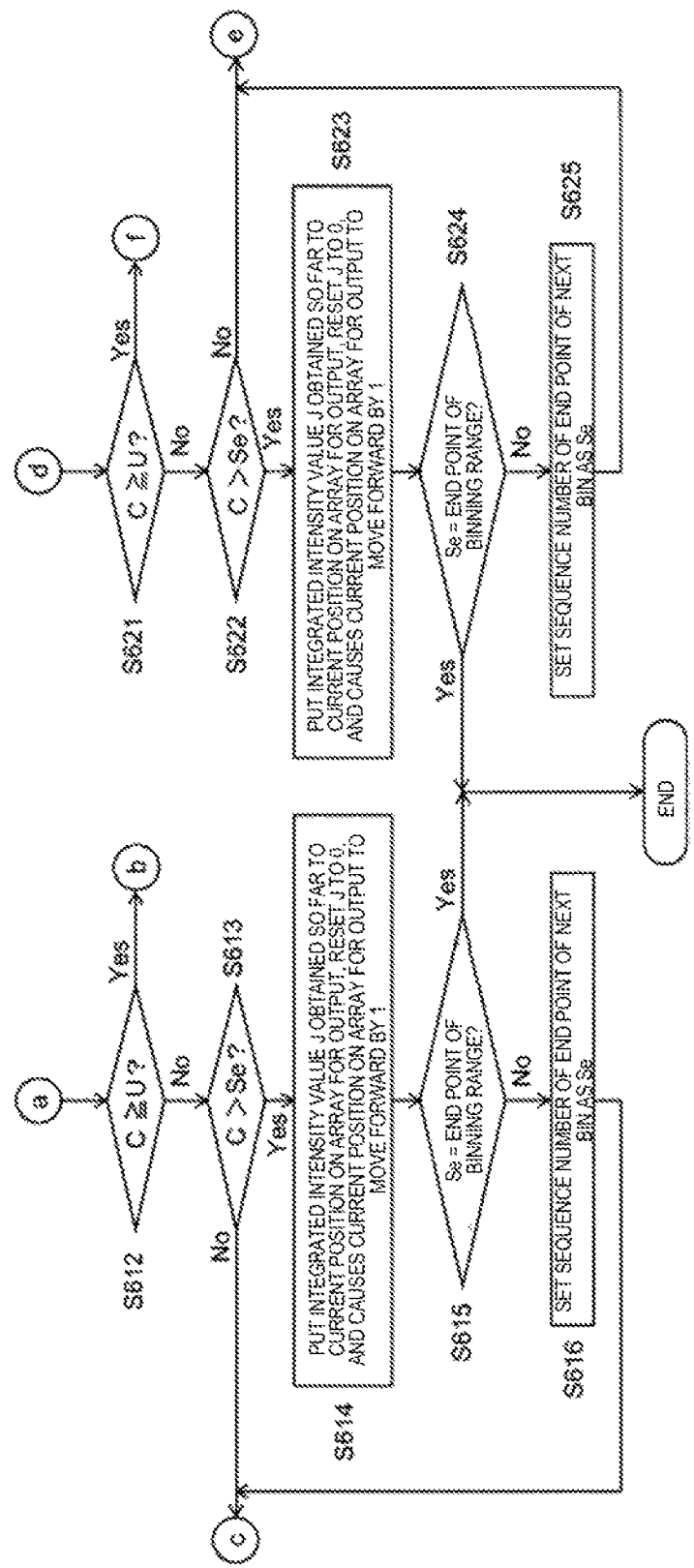
FIG. 13 is a flowchart illustrating a processing flow when the data matrix binned on the m/z axis is created from the compressed data in the second data compression method (continuation of the flowchart of FIG. 12).

FIGS. 12 and 13 are flowcharts illustrating detailed processing performed by the data reader 25 when acquiring the intensity value of each section to create a data matrix of binning in the imaging mass spectrometry system of the second embodiment. The definitions of Ss, Se, N, C, U, and P are the same as those described above. However, here, Ss and Se are upper and lower limits of the m/z range of one section for integration of intensity values. In addition, J is an integrated intensity value per section.

First, a sequence number on the uncompressed data array corresponding to a start point of the first bin, that is, the section with the smallest m/z value, is set as Ss, a sequence number on the uncompressed data array corresponding to an end point is set as Se, and a count C of a counter is set as the sequence number Ss (Step S601). Then, the sequence number Ss and the index are used to find a sequence number at the start of a block, which has a sequence number smaller than the sequence number Ss, and set a value obtained by subtracting 1 from this sequence number as the initial value of the variable U (Step S602). Next, the sequence number at the start of the block in the compressed data array is acquired from the ((U/N)+1)th data on the array of the index (Step S603). Then, this acquired value is set as the variable P (Step S604). With the processes of Steps S601 to S604, the start position to begin reading the consecutive number on the compressed data array is determined for the first bin.

A process in each step included in the subsequent S605 to S613 and S617 to S622 is the same as the process in each step of Steps S203 to S217 in FIG. 8, and thus, will not be described. When it is determined as Yes in Step S613 or S622, the processing for the bin is ended. Thus, the integrated intensity value J is moved to an array for output, and the integrated intensity value J is reset to prepare for processing for the next bin (Steps S614 and S623). Then, if reaching an end point of a binning range (Yes in Step S615 or S624), all the processes are ended. If it is determined as No in Step S615 or S624, an end point of the next bin is set as Se (Steps S616 and S625), and the processing returns to each of Steps S610 and S620.

Note that one intensity value for one section is used as the integrated intensity value here, but an average of intensity values in the section, an average value of valid intensity values, an area value, or the maximum intensity value may be used.

In addition, it is also possible to calculate an average spectrum obtained by averaging a plurality of mass spectra based on data obtained by compressing each of the plurality of mass spectra by appropriately modifying the above-described processing. In such a case, it is also possible to calculate an average spectrum limited to a specific m/z range instead of the m/z ranges of all the mass spectra. Such calculation of the average spectrum is advantageous when an average of mass spectra at a plurality of measurement points included in a region of interest (ROI) on a sample is obtained from data obtained by the imaging mass spectrometer.

In addition, when the m/z value list for creation of the data matrix is created as described above, if an average value of a plurality of target mass spectra is used in the case of excluding peaks having small intensity values to reduce the amount of data, a peak having a relatively large intensity value that appears only in a small number of mass spectra is sometimes missed from the m/z value list. In order to avoid this, there is a case where the maximum intensity value is selected from the respective mass spectra for each m/z value, and the maximum intensity spectrum having the selected maximum intensity value as the intensity value of the mass spectrum is used at the time of creating the m/z value list. The maximum intensity spectrum required in such a case can also be obtained from the data obtained by compressing the plurality of mass spectra by appropriately modifying the above-described processing.

Note that the array of m/z values, the array of the plurality of intensity values, and the index information are generally stored as a data file in an HDD or an SSD of a computer as illustrated in FIG. 2. When performing the above processing, it is preferable to temporarily read all of them into the main memory 21 and then perform the processing.

In addition, a process of reading one intensity value array and the index information required for the processing into the main memory 21, discarding the data from the main memory 21 every time the calculation process is completed for the one intensity value array, and newly reading data for the next intensity value array into the main memory 21 may be repeated. In addition, when only intensity value information in a predetermined m/z range is required, such as in the calculation process of imaging mass spectrometric data, the intensity value calculation process may be performed by selectively reading only the block including the intensity value information in the predetermined m/z range into the main memory 21 from the compressed data while referring to the index information. Of course, the procedure of such processing is not a factor that limits the present invention.

The first and second compression methods correspond to the lossy compression method that replaces the signal having the intensity value equal to or lower than the predetermined level with the consecutive number, and correspond to the compression method that is not suitable for analyzers where a signal having a minute intensity value is also important. This point is improved by the following third and fourth compression methods.

[Third Compression Method]

A principle of a third compression method related to the present invention will be described with reference to FIG. 14.

Here, it is assumed that one intensity value is represented by 8 bits in binary notation. As illustrated in FIG. 14, a bit string of 8 bits representing a signal intensity value is divided into low-order 2 bits and high-order 6 bits, and data is compressed by treating a low-order bit string as it is or performing static Huffman coding on the low-order bit string and performing the same switched run-length encoding as in the first compression method on the bit string of high-order 6 bits. When decompressing the compressed data, the original bit strings are restored respectively for the low-order bit string and the high-order bit string by a decompression algorithm corresponding to the method used for compression, and the restored bit strings are combined to restore the original data. In this manner, the lossless compression and decompression are possible. Note that the static Huffman coding may be further performed on the bit string obtained by the switched run-length encoding.

[Method for Acquiring Intensity Value Corresponding to Specific m/z Value from Compressed Data by Third Compression Method]

A bit string on a data array corresponding to a specific m/z value is acquired by performing the same processing as the processing for the data compressed by the first compression method on the bit string of the high-order 6 bits that has been subjected to the switched run-length encoding out of the data compressed by the third compression method described above. On the other hand, when the low-order 2 bits are directly stored, a bit string is read from a sequence number corresponding to the specific m/z value in the data array, and these pieces of bit information are combined to acquire the intensity value corresponding to the specific m/z value. If the static Huffman coding has been performed on the bit string of the low-order 2 bits, it is difficult to extract a value corresponding to a specific sequence number from the compressed data as in the case of the switched run-length encoding. Thus, the entire data is temporarily decompressed to extract a bit string corresponding to the specific m/z value, and the extracted bit string is combined with the bit information extracted from the bit string that has been subjected to the switched run-length encoding to acquire the intensity value corresponding to the specific m/z value.

In addition, when the static Huffman coding has been further performed on the bit string of the high-order 6 subjected to the switched run-length encoding, a value of the bit string of the high-order 6 bits corresponding to the specific m/z value is preferably obtained by the same processing as the processing for the data compressed by the first compression method after performing decompression for the static Huffman coding.

[Fourth Compression Method]

Next, a principle of a fourth compression method related to the present invention will be described with reference to FIG. 15. This compression method is a combination of the lossless compression method used in the third compression method and the block division and index creation methods used in the second compression method.

As illustrated in FIG. 15, a uncompressed data array is first divided into blocks each including a certain number of pieces of data. In this example, an array of intensity values illustrated in FIG. 14 is divided into 50 pieces of data, and compression is performed independently for each divided block according to the third compression method. Further, an index is created by collecting position information of the start of each block after compression of the respective bit strings of the bit string of low-order 2 bits and the bit string of high-order 6 bits after compression, and is stored in association with a compressed data array of each block. The index is associated with each of the compressed arrays of the bit string of the low-order 2 bits and the bit string of the high-order 6 bits. Note that a Huffman tree different for each block is used to assign a different code for each block when static Huffman coding is performed on the low-order 2 bits. Alternatively, a common Huffman tree may be used for all the blocks to assign a common code to all the blocks. Of course, the low-order 2 bits are not necessarily compressed as described in the principle of the third compression method.

[Method for Acquiring Intensity Value Corresponding to Specific m/z Value from Compressed Data by Fourth Compression Method]

The index information is referred to acquire a value of a bit string corresponding to a specific m/z value in the same manner as the processing on the data compressed by the second compression method in order to obtain the intensity value at the specific m/z value from the compressed data for the bit string subjected to the switched run-length encoding out of the information compressed in a lossless manner as described above. In addition, when the bit string of the low-order 2 bits has not been compressed, a bit string is read from the sequence number corresponding to the specific m/z value, and the intensity value corresponding to the specific m/z is extracted by combining these pieces of bit information. When the static Huffman coding has been performed on the bit string of the low-order 2 bits, the index information is referred to identify a block including the data corresponding to the specific m/z value. Then, it is preferable to decompress the entire data included in that block, acquire a bit string corresponding to the specific m/z value from the decompressed array based on a difference between the sequence number corresponding to the specific m/z value and the sequence number at the start of the block, and combine the acquired bit string with the bit string corresponding to the specific m/z value acquired from the bit string subjected to the switched run-length encoding to acquire intensity value information.

It is clear that various types of data processing with respect to the compressed data according to the first and second compression methods described above can be applied even to the compressed data according to the above third and fourth compression methods.

Table 1 show results obtained by comparing data sizes of the compressed data according to the first compression method, the compressed data according to the second compression method, and uncompressed data and comparing processing speeds. Here, assumed is imaging mass spectrometric data in which the number of measurement points within a two-dimensional area on a sample is 365×552 and an m/z range is m/z 1 to m/z 2000. Note that the time required for the process of creating the data matrix and the time required for binning do not include the time for reading a file such as compressed data, and the time required for a process of creating an ROI average spectrum includes the time for reading a file such as compressed data.

TABLE 1

| | Second compression method (+new reading method) | First compression method (+new reading method) | Non-compression |
|---|---|---|---|
| Data size (GB) | 24.6 | 24.2 | 155 |
| Time required for process of creating data matrix of predetermined m/z range (SeC) | 92 | 1624 | — |

TABLE 1-continued

| | Second compression method (+new reading method) | First compression method (+new reading method) | Non-compression |
|---|---|---|---|
| Time required for creating ROI average spectrum (SeC) | 101 | 105 | — |
| Time required for binning (0.3 Da) (sec) | 388 | 387 | — |

From the above comparison, it can be seen that the data size is reduced to about 1/6 by data compression. In addition, the uncompressed data array is divided into blocks to perform compression and the index is added in the second compression method as described above, which is disadvantageous as compared with the first compression method in terms of reducing the amount of data. However, in practice, a difference in data size between both the methods is extremely small (within 2%), and it can be said that the data reduction effect is sufficiently large even with the second compression method.

Meanwhile, when considering the results of the comparison of the processing speed between the compressed data according to the first compression method and the compressed data according to the second compression method, it can be seen that the processing speed for the compressed data according to the second compression method is extremely short in in the process of creating the data matrix although there is no significant difference in the process of creating the ROI average spectrum and the binning. As described above, the process of creating the data matrix is an indispensable process when performing multivariate analysis such as principal component analysis on a plurality of mass spectra, and the multivariate analysis is often used when analyzing the imaging mass spectrometric data. For these reasons, shortening the time required for the process of creating the data matrix is quite advantageous in terms of improving the efficiency of analysis of the imaging mass spectrometric data.

On the other hand, there is no significant difference in the process of creating the ROI average spectrum that performs calculation using data over the entire m/z range of the mass spectrum or the binning. Therefore, it is sufficient to apply the first compression method (or third compression method) and the data processing method using the first compression method (or third compression method) in cases except for the analysis of the imaging mass spectrometric data where it is necessary to frequently acquire the intensity value of the specific m/z value.

In the examples in which the data processing method and device according to the present invention are applied to the imaging mass spectrometer as described above, the following effects are specifically achieved.

(1) Since the plurality of mass spectra are represented as the common array of m/z values and the compressed array of the plurality of intensity values, the data capacity can be reduced as compared with that before compression.

(2) In general, it is necessary to decompress the compressed data to be returned to mass spectrum data, and then, to select the intensity value and perform calculation processing in the case of displaying the image on the imaging mass spectrometer or obtaining the intensity value corresponding to the specific m/z value or the integrated intensity value, the average value, the maximum value, or the like corresponding to the m/z range at the time of creating the data matrix to perform the multivariate analysis on the plurality of pieces of mass spectrum data. Since lengths of data arrays are different when the compressed data is decompressed, it is necessary to create an array different from the original compressed data and store the decompressed data in the created array. At that time, it is necessary to execute a process of copying an array of a portion where a valid intensity value is stored from the compressed data to the array of the decompressed data. On the other hand, in the data processing method according to the present invention, the target intensity value can be obtained directly from the compressed array of intensity values, and the processing speed is improved since it is unnecessary to perform the data copy.

(3) In the data processing method and device according to the present invention, it is unnecessary to temporarily decompress the compressed data when acquiring the intensity value corresponding to the target m/z value or m/z range, and thus, it is unnecessary to ensure a memory area for storing the decompressed data on the main memory. Typically, the process of calculating the intensity value is performed in the main memory of the computer, but the memory capacity used in the calculation process is much smaller than the memory capacity to store the decompressed data. In this manner, the used capacity of the main memory can be saved in the present invention.

(4) Since the mass spectrum data obtained by MALDI-TOFMS has a wide m/z range, there is also a case where the number of pieces of data in the uncompressed data for one mass spectrum exceeds 1 million. Even when the array of the uncompressed data is extremely long in this manner, it is sufficient to search for the target intensity value from the start of the block closest to the target m/z value or m/z range in the second compression method according to the present invention, and thus, the processing speed can be shortened, and the result can be output in a short time.

Note that the present invention is applied to the imaging mass spectrometer in the above embodiments, but the analyzer to which the present invention can be applied is not limited to the imaging mass spectrometer. For example, the present invention can also be applied to a Fourier transform infrared spectrophotometry (FTIR) imaging device, a Raman spectroscopic imaging device, an electron probe microanalyzer (EPMA), a chromatograph device, and the like. That is, the present invention can be applied to all analyzers that can obtain a one-dimensional array of intensity values according to a parameter such as a wave number, a wavelength, X-ray energy (X-ray wavelength), and time, instead of the m/z value.

In addition, the previous embodiments are mere examples of the present invention. Any change, modification or addition appropriately made within the spirit of the present invention from any viewpoints other than the previously described ones will naturally fall within the scope of claims of the present patent application.

REFERENCE SIGNS LIST

1 . . . Imaging Mass Spectrometer Unit
2 . . . Data Processor
20 . . . Spectrum Data Collector
21 . . . Main Memory
22 . . . Data Compressor
23 . . . Data Decompressor
24 . . . Index Creator
25 . . . Data Reader 26 . . . Image Creator
3 . . . Data Storage
30 . . . Compressed Data Memory Area
31 . . . Index Memory Area
4 . . . Operation Unit
5 . . . Display Unit

The invention claimed is:

1. An instrumental analysis data processing method of compressing measurement data which is a one-dimensional array of intensity values for a plurality of values of a predetermined parameter obtained by instrumental analysis, the instrumental analysis data processing method comprising:
   a) a data division step of dividing the array of the measurement data into blocks per predetermined number of pieces of data;
   b) an array conversion step of obtaining a compressed data array in each block by, when one or more intensity values at a predetermined invalid level are consecutive according to an array order of measurement data included in the block, replacing the intensity values collectively with a number of the consecutive intensity values for each block, and performing a switched run-length encoding when an intensity value at a significant level other than the invalid level appears; and
   c) an index creation step of creating an index by collecting information on sequence numbers indicating positions of start data of the respective blocks on an one-dimensional array, which is an array of the compressed data of the blocks, and storing the index in association with the one-dimensional array.

2. The instrumental analysis data processing method according to claim 1, wherein
   the instrumental analysis is mass spectrometry, the predetermined parameter is a mass-to-charge ratio, and the measurement data is data constituting a mass spectrum.

3. The instrumental analysis data processing method according to claim 1,
   the instrumental analysis data processing method of processing compressed data obtained by compression through processing in each step of the data division step, the array conversion step, and the index creation step,
   in order to obtain an intensity value at a specific parameter value from the compressed data, the instrumental analysis data processing method further comprising:
   d) a block identification step of referring to the index to identify a block including information obtained by compressing uncompressed data corresponding to a sequence number of data at the specific parameter value as a target and obtaining information on a start data position of the block;
   e) a consecutive number identification step of acquiring and sequentially adding information on a number of consecutive intensity values at a significant level and a number of consecutive intensity values at an invalid level in order from a start of an array of compressed data corresponding to the identified block, and identifying a consecutive number when a result of the addition matches the sequence number corresponding to the specific parameter value as the target or a consecutive number immediately before the addition result exceeds the sequence number; and
   f) an intensity value search step of outputting information indicating the invalid level, or a specific intensity value associated with the invalid level, as the intensity value at the specific parameter value when the consecutive number identified in the consecutive number identification step is the number of consecutive intensity values at the invalid level, and finding and outputting an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

4. An instrumental analysis data processing device, configured to compress measurement data which is a one-dimensional array of intensity values for a plurality of values of a predetermined parameter obtained by instrumental analysis, the instrumental analysis data processing device comprising:
   a) a data division unit configured to divide the array of the measurement data into blocks per predetermined number of pieces of data;
   b) an array conversion unit configured to obtain a compressed data array in each block by, when one or more intensity values at a predetermined invalid level are consecutive according to an array order of measurement data included in the block, replacing the intensity values collectively with a number of the consecutive intensity values for each block, and performing a switched run-length encoding when an intensity value at a significant level other than the invalid level appears; and
   c) an index creation unit configured to create an index by collecting information on sequence numbers indicating positions of start data of the respective blocks on an one-dimensional array, which is an array of the compressed data of the blocks, and store the index in association with the one-dimensional array.

5. The instrumental analysis data processing device according to claim 4, wherein
   the instrumental analysis is mass spectrometry, the predetermined parameter is a mass-to-charge ratio, and the measurement data is data constituting a mass spectrum.

6. The instrumental analysis data processing device according to claim 4,
   the instrumental analysis data processing device configured to process compressed data obtained by compression through processing in each unit of the data division unit, the array conversion unit, and the index creation unit,
   in order to obtain an intensity value at a specific parameter value from the compressed data, the instrumental analysis data processing device further comprising:
   d) a block identification unit configured to refer to the index to identify a block including information obtained by compressing uncompressed data corresponding to a sequence number of data at the specific parameter value as a target, and to obtain information on a start data position of the block;
   e) a consecutive number identification unit configured to acquire and sequentially add information on a number of consecutive intensity values at a significant level and a number of consecutive intensity values at an invalid level in order from a start of an array of compressed data corresponding to the identified block, and to identify a consecutive number when a result of the addition matches the sequence number corresponding to the specific parameter value as the target or a consecutive number when the addition result exceeds the sequence number; and f) an intensity value search unit configured to output information indicating the invalid level, or a specific intensity value associated with the invalid level as the intensity value at the specific parameter value when the consecutive number identified by the consecutive number identification unit is the number of consecutive intensity values at the invalid level, and to find and output an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

7. An instrumental analysis data processing method of processing compressed data obtained by compressing measurement data which is a one-dimensional array of intensity values for a plurality of values of a predetermined parameter obtained by instrumental analysis by, when one or more intensity values at a predetermined invalid level are consecutive according to an array order, replacing the intensity values collectively with a number of the consecutive intensity values, and performing a switched run-length encoding when an intensity value at a significant level other than the invalid level appears, the instrumental analysis data processing method of obtaining an intensity value at a specific parameter value from the compressed data comprising:
   a) a consecutive number identification step of acquiring and sequentially adding information on a number of consecutive intensity values at a significant level and a number of consecutive intensity values at an invalid level in order from a start of an array of compressed data to be processed, and identifying a consecutive number when a result of the addition matches the sequence number corresponding to the specific parameter value as the target or a consecutive number when the addition result exceeds the sequence number; and
   b) an intensity value search step of outputting information indicating the invalid level or a specific intensity value associated with the invalid level as the intensity value at the specific parameter value when the consecutive number identified in the consecutive number identification step is the number of consecutive intensity values at the invalid level, and finding and outputting an intensity value of the sequence number from among intensity values between data indicating the consecutive number on the compressed data array and data indicating a consecutive number appearing next as the intensity value at the specific parameter value when the identified consecutive number is the number of consecutive intensity values at the significant level.

8. The instrumental analysis data processing method according to claim 7, wherein
   the instrumental analysis is mass spectrometry, the predetermined parameter is a mass-to-charge ratio, and the measurement data is data constituting a mass spectrum.

9. An instrumental analysis data processing device configured to process compressed data obtained by compressing measurement data which is a one-dimensional array of intensity values for a plurality of values of a predetermined parameter obtained by instrumental analysis by, when one or more intensity values at a predetermined invalid level are consecutive according to an array order, replacing the intensity values collectively with a number of the consecutive intensity values, and performing a switched run-length encoding when an intensity value at a significant level other than the invalid level appears, the instrumental analysis data processing device, which obtains an intensity value at a specific parameter value from the compressed data, comprising:
   a) a consecutive number identification unit configured to acquire and sequentially add information on a number of consecutive intensity values at a significant level and a number of consecutive intensity values at an invalid level in order from a start of an array of compressed data to be processed, and to identify a consecutive number when a result of the addition matches the sequence number corresponding to the specific parameter value as the target or a consecutive number when the addition result exceeds the sequence number; and
   b) an intensity value search unit configured to output information indicating the invalid level or a specific intensity value associated with the invalid level as the intensity value at the specific parameter value when the consecutive number identified by the consecutive number identification unit is the number of consecutive intensity values at the invalid level, and to find and output an intensity value of a relevant order from among intensity values between data indicating the consecutive number on the compressed data array and data indicating a consecutive number appearing next as the intensity value at the specific parameter value when the identified consecutive number is the number of consecutive intensity values at the significant level.

10. The instrumental analysis data processing device according to claim 9, wherein
    the instrumental analysis is mass spectrometry, the predetermined parameter is a mass-to-charge ratio, and the measurement data is data constituting a mass spectrum.

11. An instrumental analysis data processing method of dividing a bit string of measurement data, which is a one-dimensional array of intensity values for a plurality of values in a predetermined parameter obtained by instrumental analysis, into a low-order bit string equal to or lower than a predetermined level and a high-order bit string other than the low-order bit string to obtain a plurality of data arrays and processing compressed data formed of a plurality of compressed data arrays obtained by performing compression on a data array including the high-order bit string using at least switched run-length encoding and not performing compression on a data array including the low-order bit string, the instrumental analysis data processing method of obtaining an intensity value at a specific parameter value from the compressed data, comprising:
    a) a consecutive number identification step of acquiring and sequentially adding information on a consecutive number of a bit string indicating a value other than "0" and a consecutive number of a bit string indicating "0" in order from a start of a compressed data array corresponding to the high-order bit string among the plurality of compressed data arrays to be processed, and identifying a consecutive number when a result of the addition matches a sequence number corresponding to the specific parameter value as a target or a consecutive number immediately before the addition result exceeds the sequence number;
    b) a high-order bit information search step of outputting a value of "0" as a high-order bit string in the specific parameter value when the identified consecutive number is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and c) an intensity value acquisition step of acquiring information on the low-order bit string from the sequence number corresponding to the specific parameter value in the compressed data array corresponding to the low-order bit string, and acquiring intensity value information for the specific parameter value together with information on the bit string output by the high-order bit information search step.

12. An instrumental analysis data processing method of dividing a bit string of measurement data, which is a one-dimensional array of intensity values for a plurality of values in a predetermined parameter obtained by instrumental analysis, into a low-order bit string equal to or lower than a predetermined level and a high-order bit string other than the low-order bit string to obtain a plurality of data arrays and processing compressed data formed of a plurality of compressed data arrays obtained by performing compression on a data array including the high-order bit string using at least switched run-length encoding and performing compression on a data array including the low-order bit string using static Huffman coding, the instrumental analysis data processing method of obtaining an intensity value at a specific parameter value from the compressed data, comprising:

a) a consecutive number identification step of acquiring and sequentially adding information on a consecutive number of a bit string indicating a value other than "0" and a consecutive number of a bit string indicating "0" in order from a start of a compressed data array corresponding to the high-order bit string among the plurality of compressed data arrays to be processed, and identifying a consecutive number when a result of the addition matches a sequence number corresponding to the specific parameter value as a target or a consecutive number immediately before the addition result exceeds the sequence number;

b) a high-order bit information search step of outputting a value of "0" as a high-order bit string in the specific parameter value when the identified consecutive number is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and c) an intensity value acquisition step of decompressing all compressed data arrays corresponding to the low-order bit string among the plurality of compressed data arrays to be processed, acquiring information on the low-order bit string corresponding to the specific parameter value from the decompressed data array, and acquiring intensity value information for the specific parameter value together with information on the bit string output by the high-order bit information search step.

13. An instrumental analysis data processing method of compressing measurement data, which is a one-dimensional array of intensity values for a plurality of values in a predetermined parameter obtained by instrumental analysis, comprising:

a) a data division step of dividing the array of the measurement data into blocks per predetermined number of pieces of data;

b) an array conversion step of dividing a bit string of the measurement data included in a relevant block into a low-order bit string equal to or lower than a predetermined level and a high-order bit string other than the low-order bit string per each of the blocks obtained in the data division step to obtain a plurality of data arrays, and obtaining a plurality of compressed data arrays in the respective blocks by performing at least switched run-length encoding on a data array including the high-order bit string and performing no compression or static Huffman coding on a data array including the low-order bit string per each of the blocks; and c) an index creation step of creating indices storing information on positions of a start of each of the blocks on the plurality of compressed data arrays by collecting information on sequence numbers indicating positions of start data of the respective blocks on an one-dimensional array, which is an array of the data, for the plurality of compressed data arrays in the respective blocks, and storing the indices in association with the plurality of compressed data arrays in the respective blocks obtained in the array conversion step.

14. The instrumental analysis data processing method according to claim 13, the instrumental analysis data processing method of processing compressed data obtained by compression in each step of the data division step, the array conversion step, and the index creation step, the compressed data in which compression is not performed on the low-order bit string in the array conversion step, the method further comprising:

in order to obtain an intensity value at a specific parameter value from the compressed data, d) a first block identification step of referring to an index corresponding to the high-order bit string among the indices to identify a block including information obtained by compressing an uncompressed high-order bit string corresponding to a sequence number of data at the specific parameter value as a target and obtaining information on a start data position of the block;

e) a consecutive number identification step of acquiring and sequentially adding information on a consecutive number of a bit string indicating a value other than "0" and a consecutive number of a bit string indicating "0" in order from a start of a compressed data array corresponding to the block identified in the first block identification step, and identifying a consecutive number when a result of the addition matches a sequence number corresponding to the specific parameter value as a target or a consecutive number immediately before the addition result exceeds the sequence number;

f) a high-order bit information search step of outputting a value of "0" as a high-order bit string in the specific parameter value when the consecutive number identified in the consecutive number identification step is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and g) an intensity value acquisition step of acquiring information on the low-order bit string from the sequence number corresponding to the specific parameter value, and acquiring intensity value information for the specific parameter value together with information on the bit string output by the high-order bit information search step.

15. The instrumental analysis data processing method according to claim 13, the instrumental analysis data processing method of processing compressed data obtained by compression in each step of the data division step, the array conversion step, and the index creation step, the compressed data in which static Huffman coding has been performed on the low-order bit string in the array conversion step, the method further comprising:

in order to obtain an intensity value at a specific parameter value from the compressed data, d) a first block identification step of referring to an index corresponding to the high-order bit string among the indices to identify a block including information obtained by compressing an uncompressed high-order bit string corresponding to a sequence number of data at the specific parameter value as a target and obtaining information on a start data position of the block;

e) a consecutive number identification step of acquiring and sequentially adding information on a consecutive number of a bit string indicating a value other than "0" and a consecutive number of a bit string indicating "0" in order from a start of a compressed data array corresponding to the block identified in the first block identification step, and identifying a consecutive number when a result of the addition matches a sequence number corresponding to the specific parameter value as a target or a consecutive number immediately before the addition result exceeds the sequence number;

f) a high-order bit information search step of outputting a value of "0" as a high-order bit string in the specific parameter value when the consecutive number identified in the consecutive number identification step is the consecutive number of the bit string indicating "0" and finding and outputting a bit string of the sequence number from among bit strings between data indicating the consecutive number on the compressed data array and data indicating a consecutive number appearing next as a high-order bit string in the specific parameter value when the identified consecutive number is the consecutive number of the bit string indicating the value other than "0"; and g) a second block identification step of referring to an index corresponding to the low-order bit string among the indices to identify a block including an uncompressed low-order bit string corresponding to a sequence number of data at the specific parameter value as a target and obtaining information on a start data position of the block; and h) an intensity value acquisition step of decompressing all compressed data arrays derived from low-order bits corresponding to the block identified in the second block identification step, acquiring information on the low-order bit string corresponding to the specific parameter value from a decompressed data array based on a difference between the sequence number corresponding to the specific parameter value and a sequence number at the start of the block, and acquiring intensity value information for the specific parameter value together with information on the bit string output by the high-order bit information search step.

16. The instrumental analysis data processing method according to claim 11, wherein
the instrumental analysis is mass spectrometry, the predetermined parameter is a mass-to-charge ratio, and the measurement data is data constituting a mass spectrum.

17. An instrumental analysis data processing device configured to compress measurement data, which is a one-dimensional array of intensity values for a plurality of values in a predetermined parameter obtained by instrumental analysis, comprising:

a) a data division unit configured to divide the array of the measurement data into blocks per predetermined number of pieces of data;

b) an array conversion unit configured to divide a bit string of the measurement data included in a relevant block into a low-order bit string equal to or lower than a predetermined level and a high-order bit string other than the low-order bit string per each of the blocks obtained by the data division unit to obtain a plurality of data arrays, and to obtain a plurality of compressed data arrays in the respective blocks by performing at least switched run-length encoding on a data array including the high-order bit string and performing no compression or static Huffman coding on a data array including the low-order bit string per each of the blocks; and c) an index creation unit configured to create indices storing information on positions of a start of each of the blocks on the plurality of compressed data arrays by collecting information on sequence numbers indicating positions of start data of the respective blocks on an one-dimensional array, which is an array of the data, for the plurality of compressed data arrays in the respective blocks, and to store the indices in association with the plurality of compressed data arrays in the respective blocks obtained by the array conversion unit.

18. The instrumental analysis data processing device according to claim 17, wherein
the instrumental analysis is mass spectrometry, the predetermined parameter is a mass-to-charge ratio, and the measurement data is data constituting a mass spectrum.

19. The instrumental analysis data processing method according to claim 12, wherein
the instrumental analysis is mass spectrometry, the predetermined parameter is a mass-to-charge ratio, and the measurement data is data constituting a mass spectrum.

20. The instrumental analysis data processing method according to claim 13, wherein
the instrumental analysis is mass spectrometry, the predetermined parameter is a mass-to-charge ratio, and the measurement data is data constituting a mass spectrum.

* * * * *